United States Patent
Surthi et al.

(10) Patent No.: US 11,081,498 B2
(45) Date of Patent: Aug. 3, 2021

(54) INTEGRATED ASSEMBLIES HAVING VERTICALLY-SPACED CHANNEL MATERIAL SEGMENTS, AND METHODS OF FORMING INTEGRATED ASSEMBLIES

(71) Applicant: Micron Technology, Inc., Boise, ID (US)

(72) Inventors: Shyam Surthi, Boise, ID (US); Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 16/548,120

(22) Filed: Aug. 22, 2019

(65) Prior Publication Data
US 2021/0057435 A1 Feb. 25, 2021

(51) Int. Cl.
*H01L 27/11582* (2017.01)
*H01L 45/00* (2006.01)
*H01L 21/768* (2006.01)
*G11C 16/08* (2006.01)

(52) U.S. Cl.
CPC .. *H01L 27/11582* (2013.01); *H01L 21/76883* (2013.01); *H01L 45/16* (2013.01); *G11C 16/08* (2013.01)

(58) Field of Classification Search
None
See application file for complete search history.

(56) References Cited

U.S. PATENT DOCUMENTS

2012/0267701 A1* 10/2012 Chae ................ G11C 5/02
257/324

* cited by examiner

*Primary Examiner* — Daniel Whalen
(74) *Attorney, Agent, or Firm* — Wells St. John P.S.

(57) ABSTRACT

Some embodiments include a NAND memory array having a vertical stack of alternating insulative levels and conductive levels. The conductive levels include control gate regions and distal regions proximate the control gate regions. The control gate regions have front surfaces, top surfaces and bottom surfaces. The top and bottoms surfaces extend back from the front surfaces. High-k dielectric material is along the control gate regions. The high-k dielectric material has first regions along the top and bottom surfaces, and has second regions along the front surfaces. The first regions are thicker than the second regions. Charge-blocking material is adjacent to the second regions of the high-k dielectric material. Charge-storage material is adjacent to the charge-blocking material. Gate-dielectric material is adjacent to the charge-storage material. Channel material is adjacent to the gate-dielectric material. Some embodiments include integrated assemblies. Some embodiments include methods of forming integrated assemblies.

19 Claims, 35 Drawing Sheets

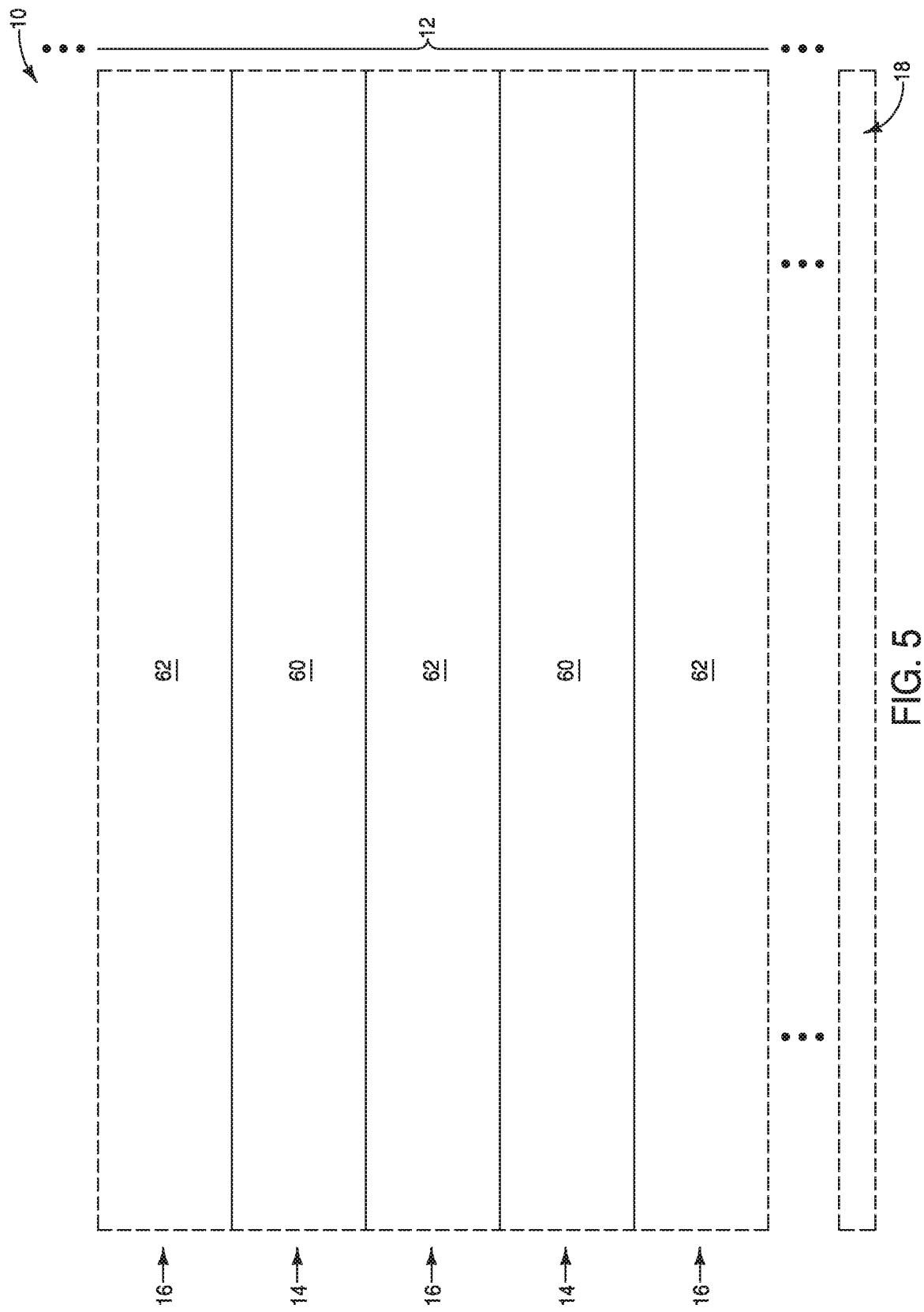

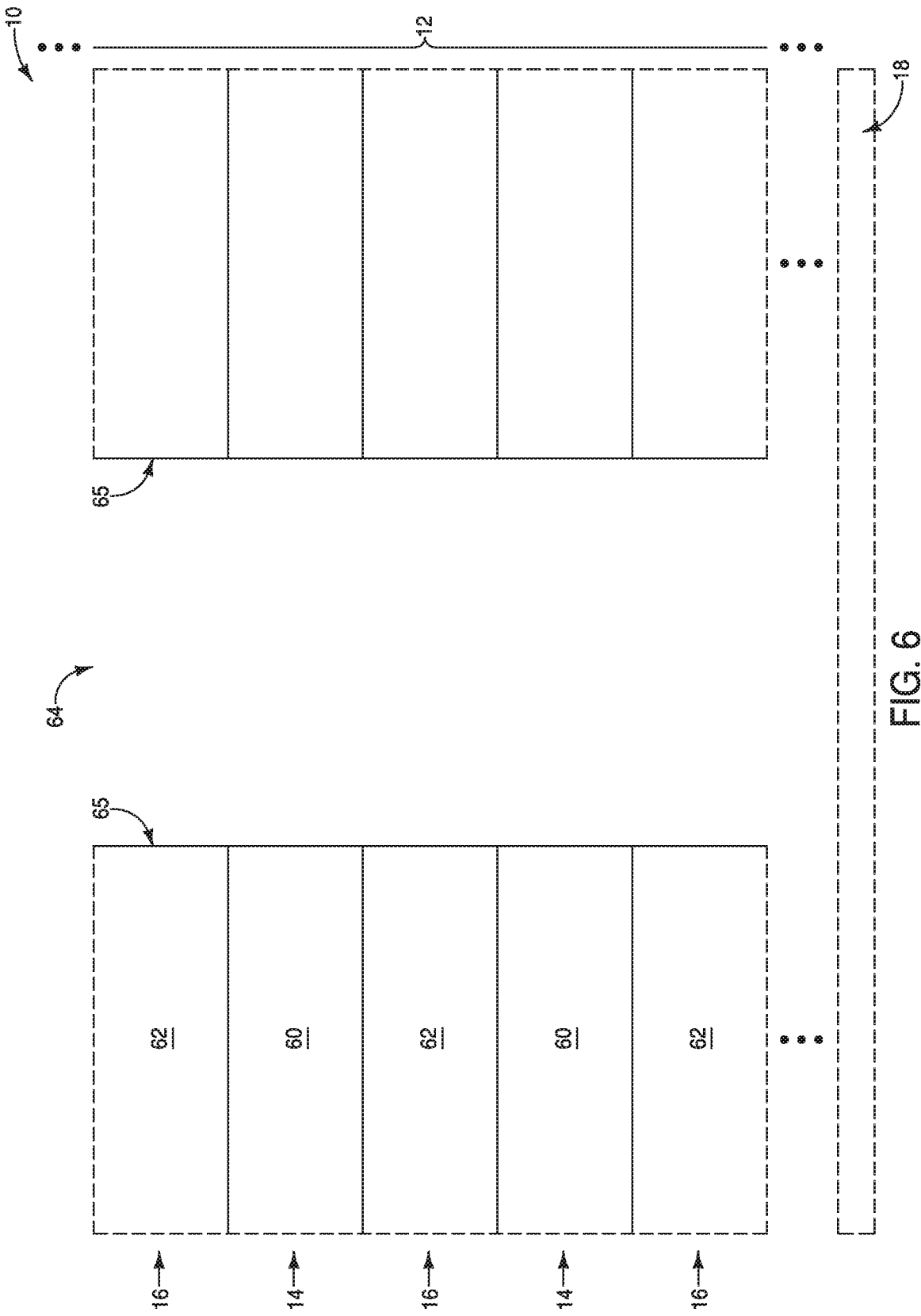

US 11,081,498 B2

INTEGRATED ASSEMBLIES HAVING VERTICALLY-SPACED CHANNEL MATERIAL SEGMENTS, AND METHODS OF FORMING INTEGRATED ASSEMBLIES

TECHNICAL FIELD

Integrated assemblies (e.g., integrated NAND memory) having vertically-spaced channel material segments, and methods of forming integrated assemblies.

BACKGROUND

Memory provides data storage for electronic systems. Flash memory is one type of memory, and has numerous uses in modem computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQO through DQN on the 110 lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the AO through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semi-conductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as word-lines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may he coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may he any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for thbricating NAND architecture.

BRIEF DESCRIPTION OF THE DRAWINGS

FIGS. 5 and 6 are diagrammatic cross-sectional side views of a region of an integrated assembly shown at example sequential process stages of an example method for forming an example NAND memory array.

DETAILED DESCRIPTION OF THE ILLUSTRATED EMBODIMENTS

Figure 1:
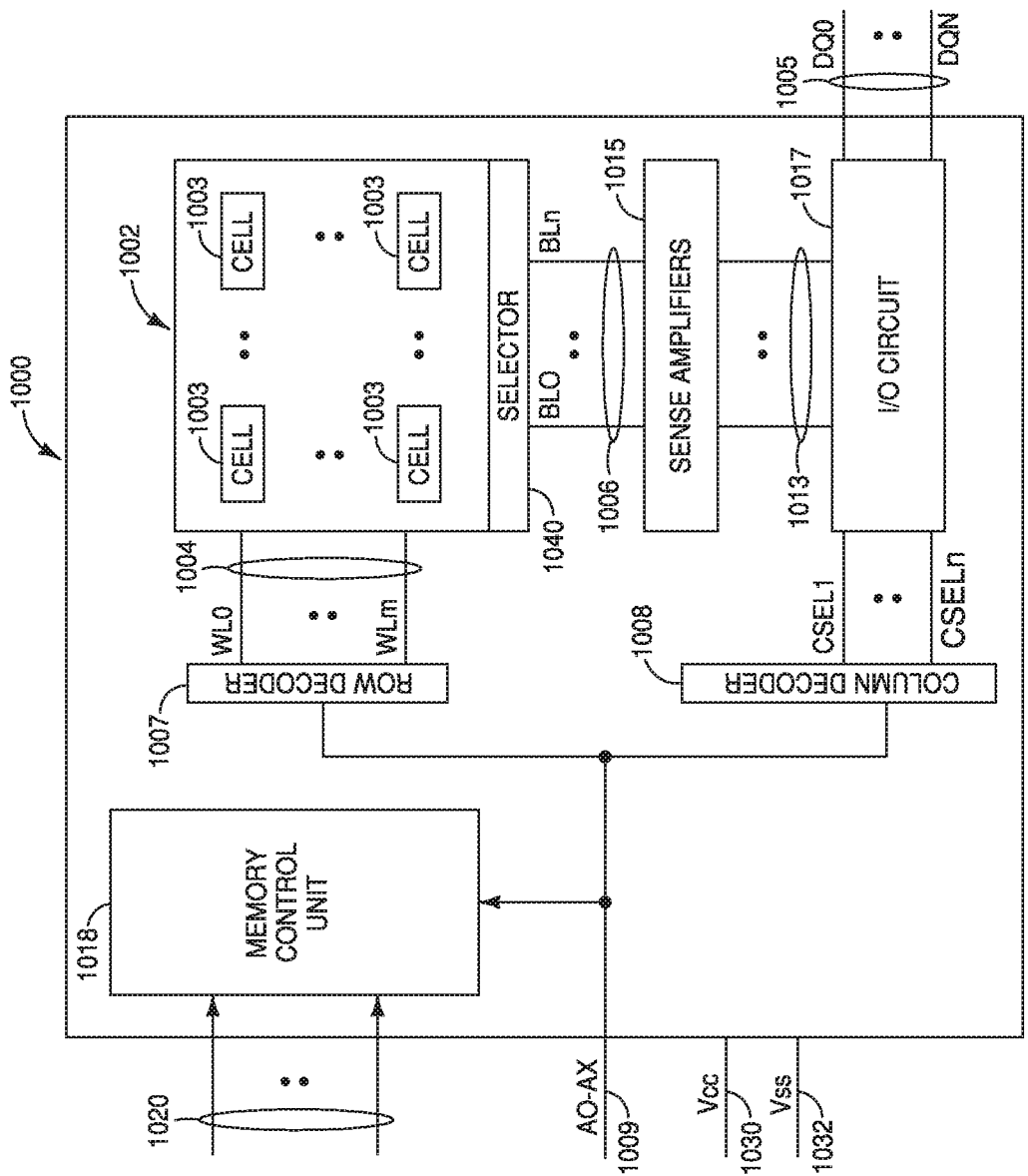
FIG. 1 shows a block diagram of a prior art memory device having a memory array with memory cells.
Figure 2:
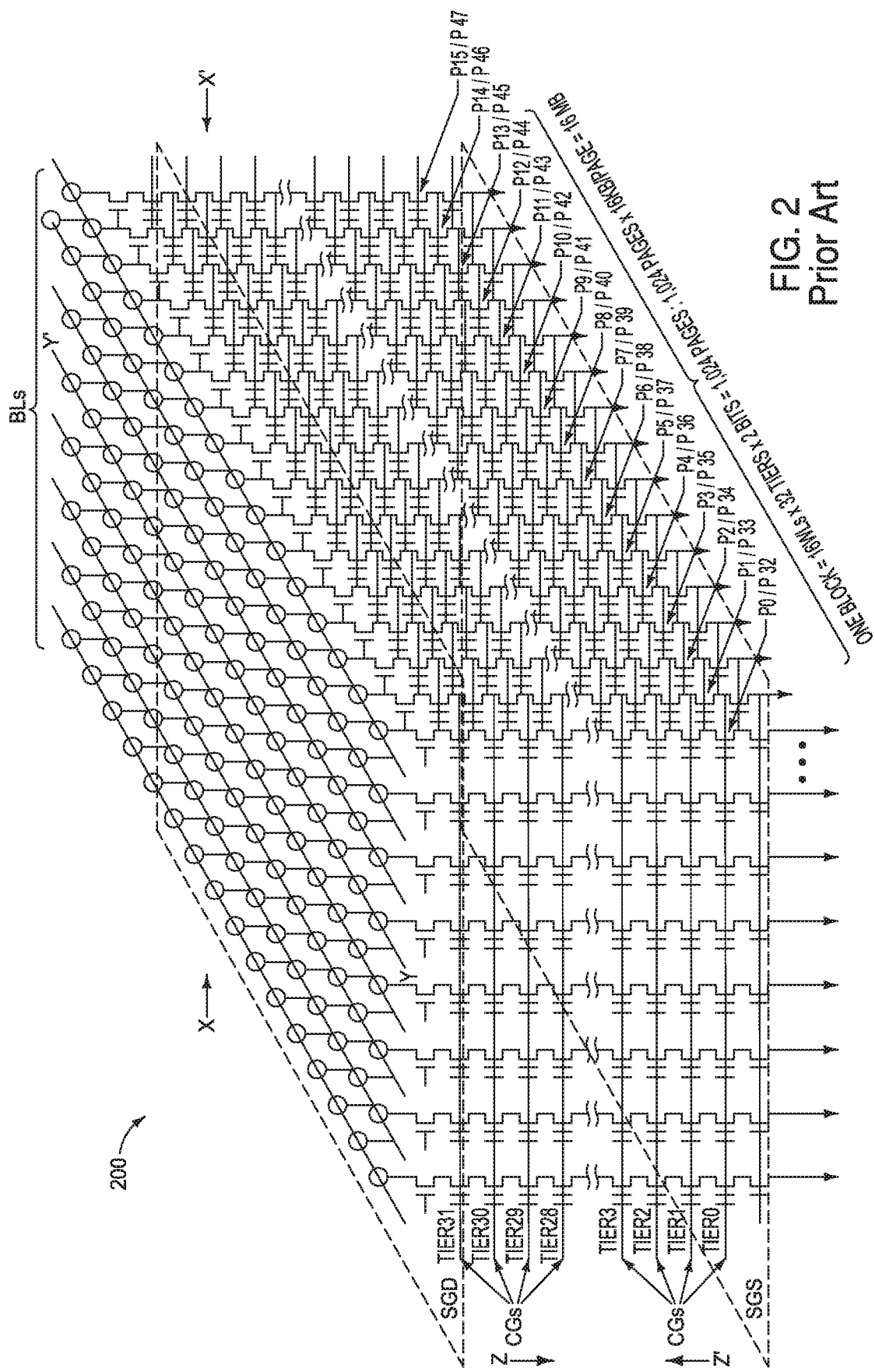
FIG. 2 shows a schematic diagram of the prior art memory array of FIG. 1 in the form of a 3D NAND memory device.
Figure 3:
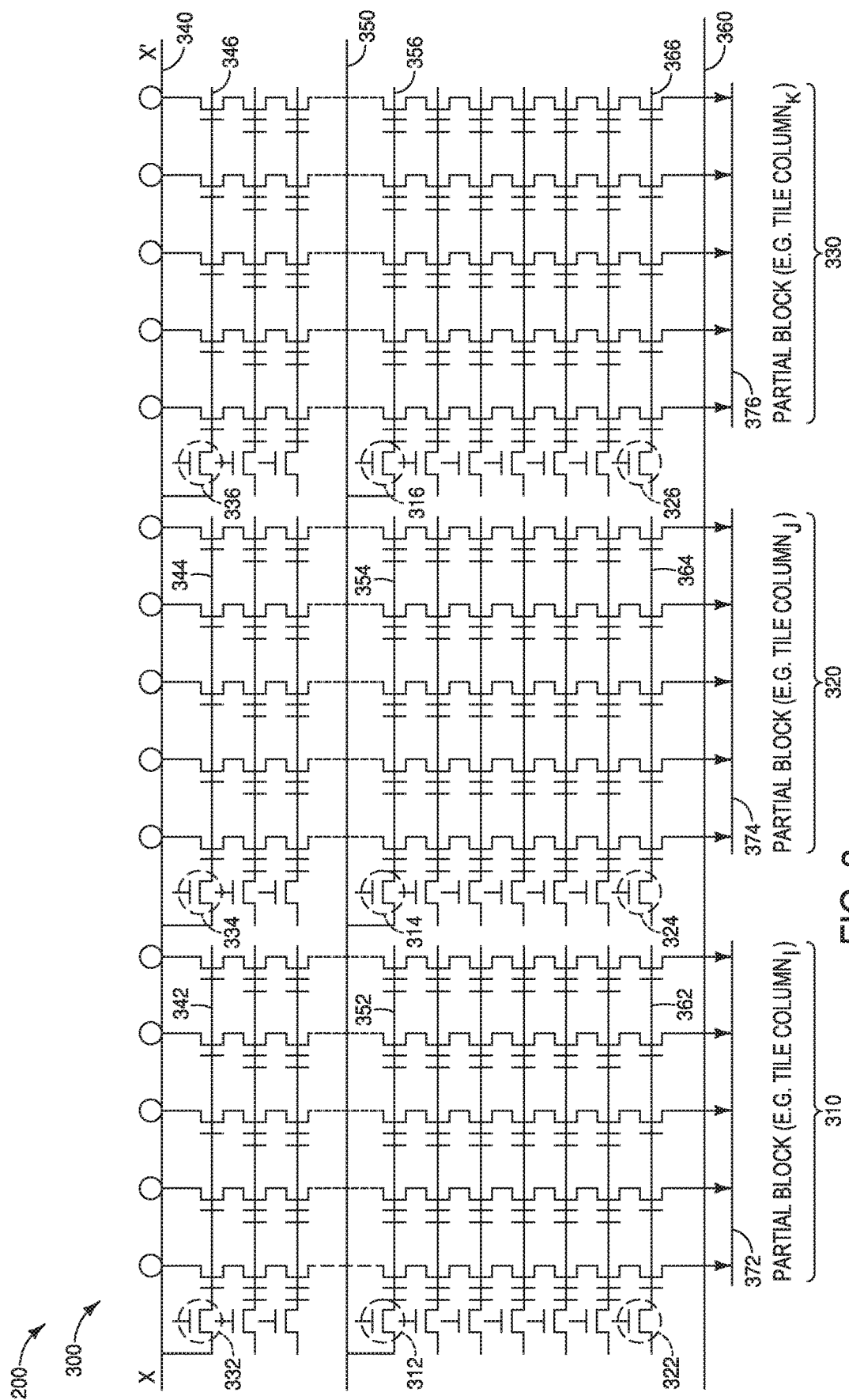
FIG. 3 shows a cross-sectional view of the prior art 3D NAND memory device of FIG. 2 in an X-X' direction.
Figure 4:
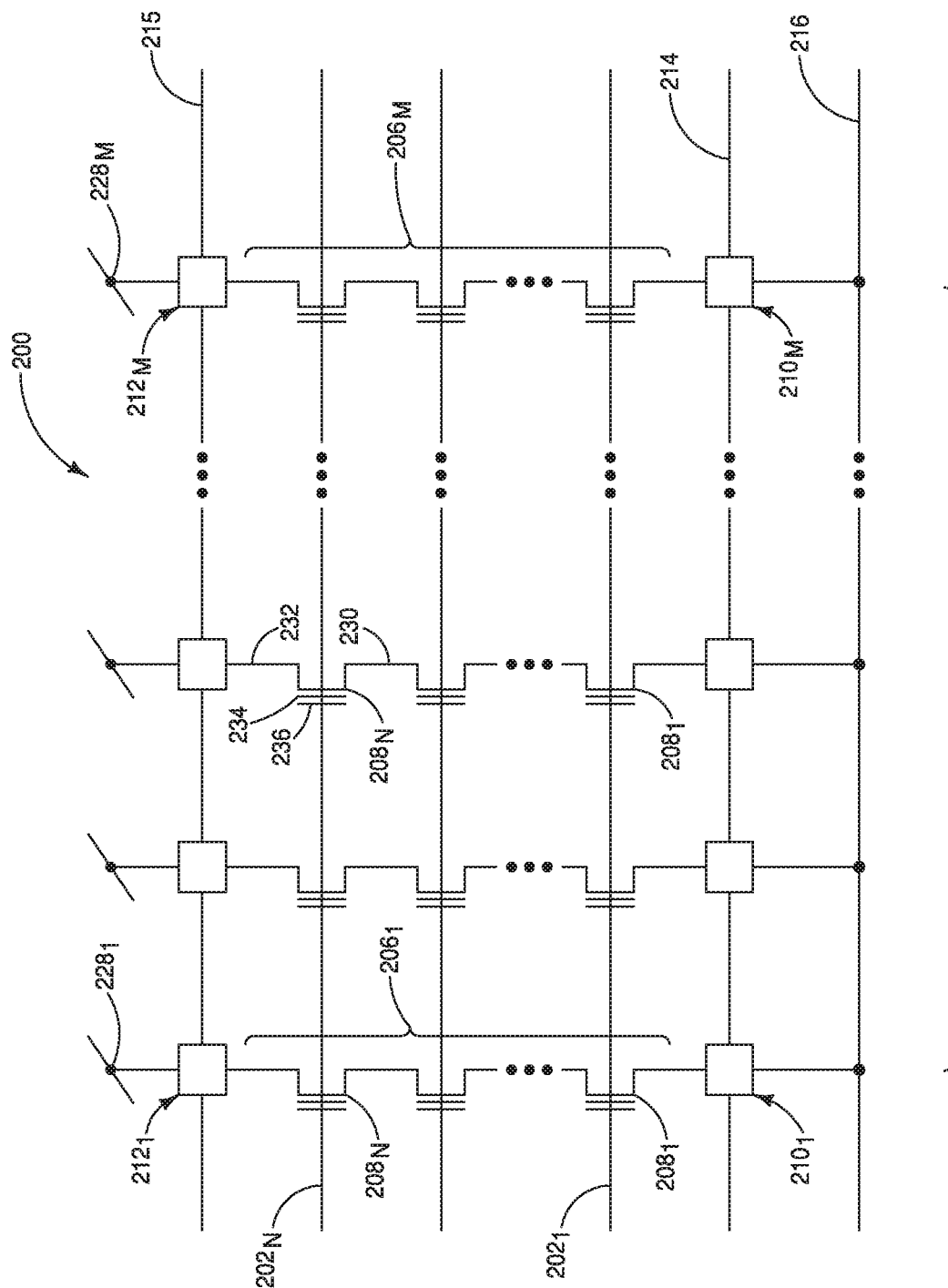
FIG. 4 is a schematic diagram of a prior art NAND memory array.

Operation of NANI) memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may advantageously impede migration of charge between memory cells. Example embodiments are described with reference to FIGS. 5-35.

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

Figure 6A:
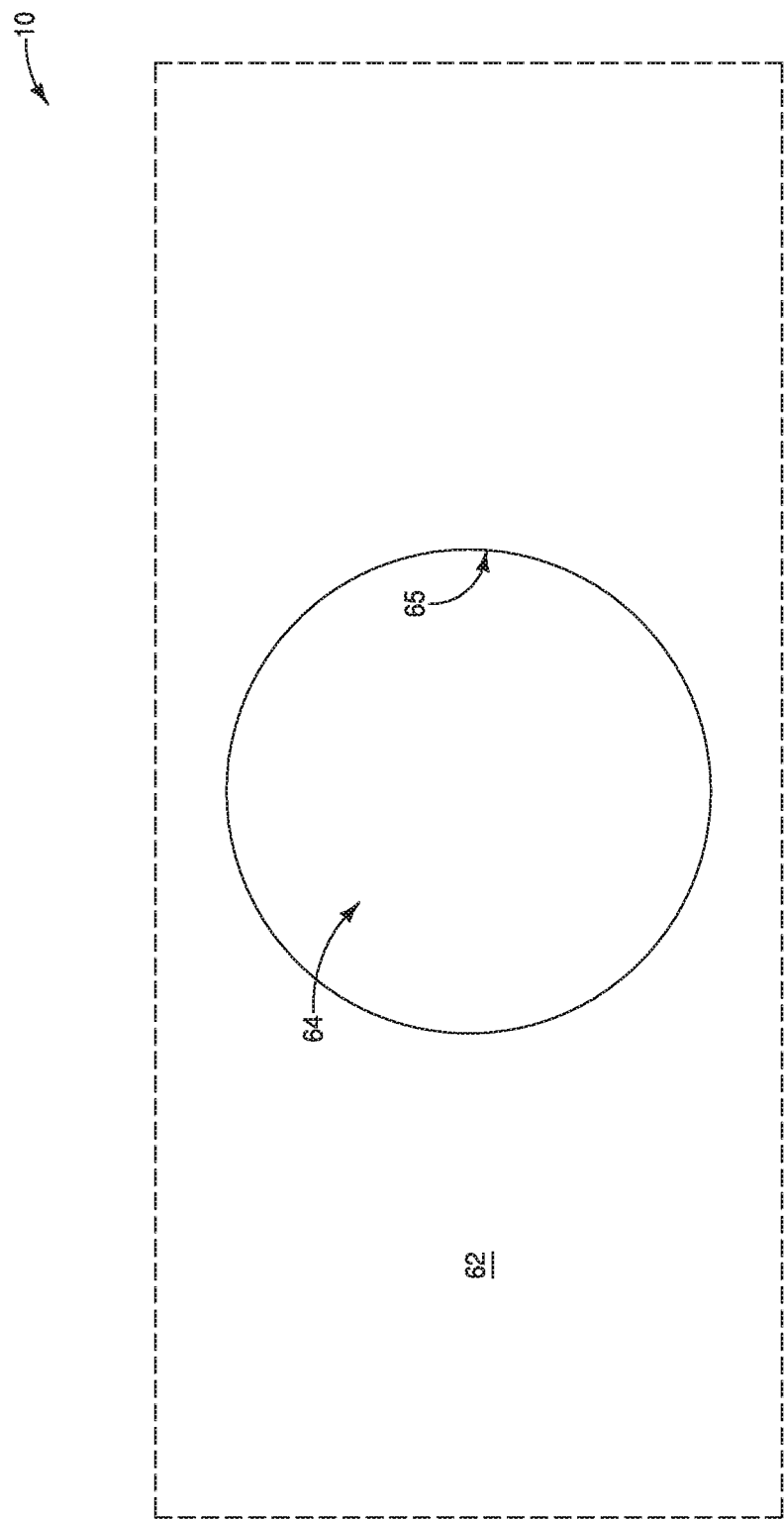
FIG. 6A is a diagrammatic top view of a portion of the integrated assembly of FIG. 6.

Referring to FIG. 6, an opening 64 is formed to extend through the stack 12. The opening 64 has sidewalls 65 extending along the first and second materials 60 and 62. The opening 64 may have a closed shape (circular, elliptical, polygonal, etc.) when viewed from above (as shown in FIG. 6A), and the sidewalls 65 shown in the cross-section of FIG. 6 may be part of a single continuous sidewall that extends around the closed shape of the opening 64 (as shown in FIG. 6A). The opening 64 may be representative of a large number of substantially identical openings formed at the process stage of FIG. 6 and utilized for fabricating NAND memory cells of a NAND memory array. The term "substantially identical" means identical to within reasonable tolerances of fabrication and measurement.

Figure 7:
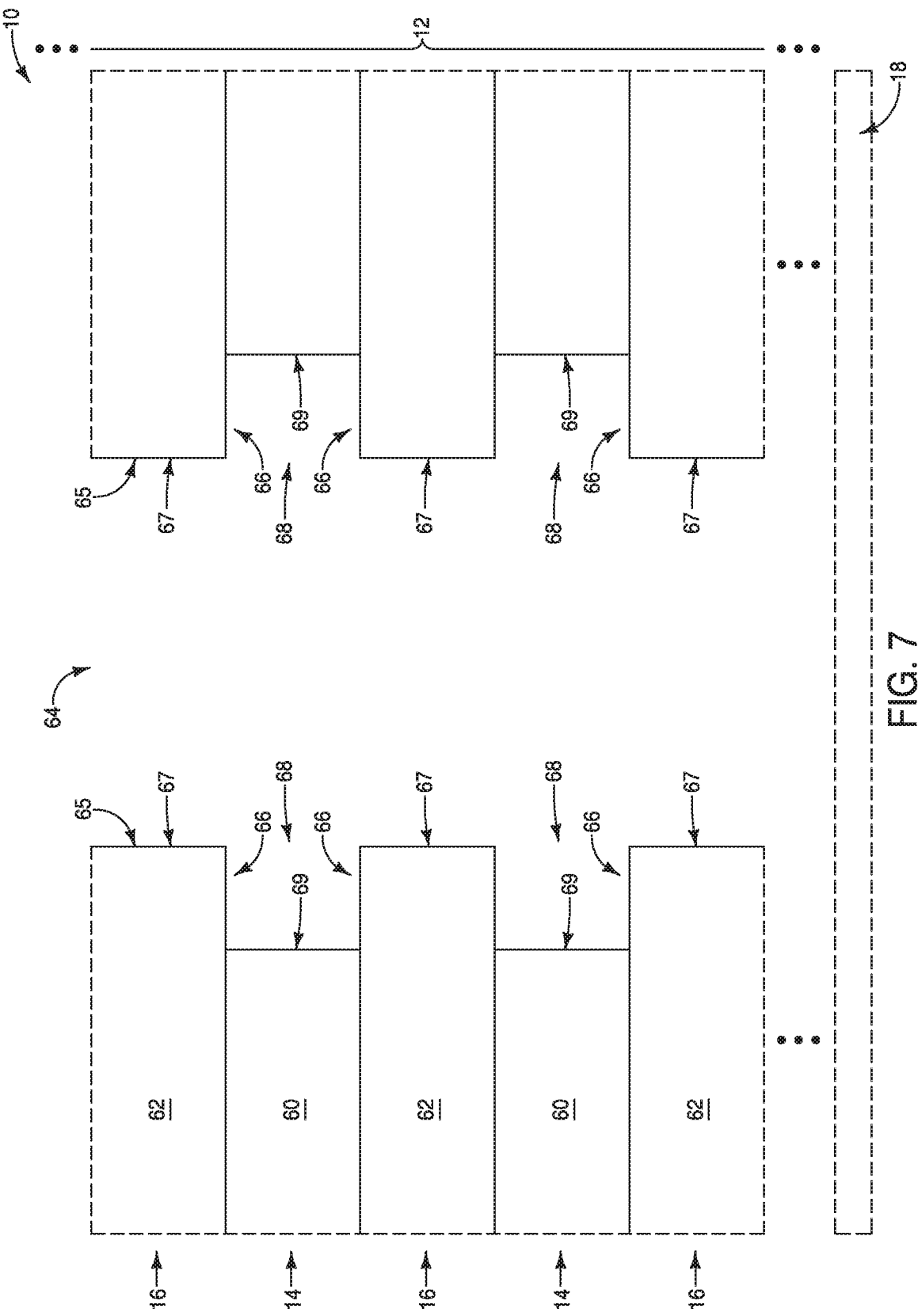
FIGS. 7-20 are diagrammatic cross-sectional side views of the region of the integrated assembly of FIG. 5 shown at example sequential process stages of an example method for forming an example NAND memory array. The process stage of FIG. 7 follows the process stage of FIG. 6.

Referring to FIG. 7, the first levels 14 are recessed relative to the second levels 16 along the sidewalls 65 of the opening 64. After the recessing, the second levels 16 have projecting terminal ends 66 which extend beyond the recessed first levels 14. The terminal ends 66 have surfaces 67 of the second material 62. The recessed first levels 14 have surfaces 69 of the first material 60. Cavities (gaps) 68 are vertically between the terminal ends 66. The surfaces 69 may be considered to be along inner edges of the cavities 68.

The surfaces 67 and 69 together form an undulating sidewall surface 65 of the opening 64 at the process stage of FIG. 7.

Figure 8:
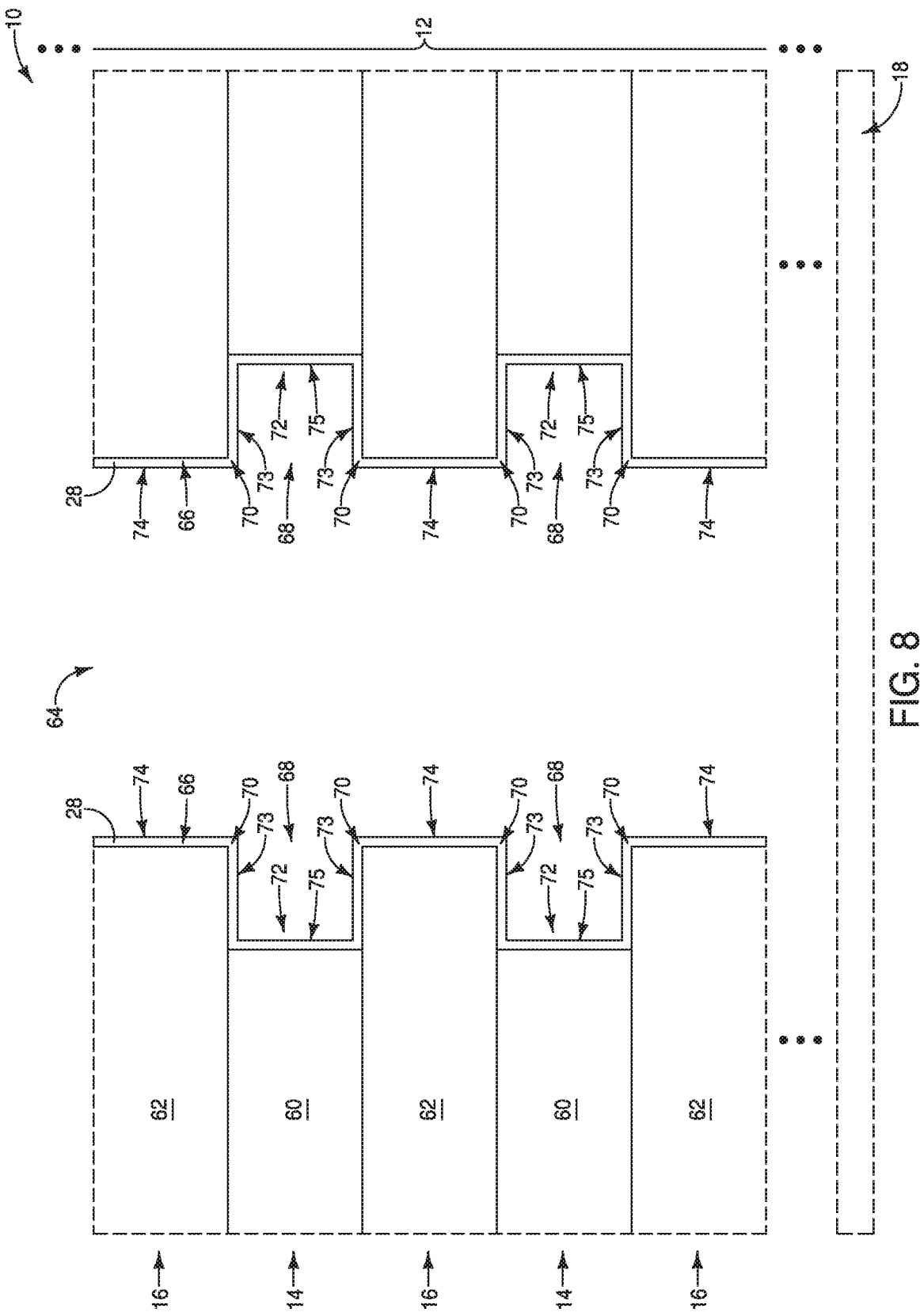

Referring to FIG. 8, high-k dielectric material 28 is formed along the undulating sidewall surface 65. The term "high-k" means a dielectric constant greater than that of silicon dioxide. In some embodiments, the high-k dielectric material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The high-k dielectric material 28 has a substantially uniform thickness along the entirety of the undulating sidewall 65; with the term "substantially uniform" meaning uniform to within reasonable tolerances of fabrication and measurement. The high-k dielectric material 28 may be formed to any suitable thickness; and in some embodiments may be formed to a thickness within a range of from about 1 nm to about 6 nm.

The high-k dielectric material 28 wraps around the terminal ends 66. In the illustrated embodiment, the terminal ends 66 have substantially square corners 70, and the high-k dielectric material 28 extends around such substantially square corners. In other embodiments, the corners 70 may be more rounded.

The high-k dielectric material may be considered to have first portions 72 within the cavities 68, and to have second portions 74 outward of the cavities. The first portions 72 have substantially horizontal segments 73 along the second material 62 of the second levels 16, and have substantially vertical segments 75 along the first material 60 of the first levels 14. The substantially vertical segments 75 extend between the substantially horizontal segments 73. The term "substantially vertical" means vertical to within reasonable tolerances of fabrication and measurement; and the term "substantially horizontal" means horizontal to within reasonable tolerances of fabrication and measurement.

Figure 9:
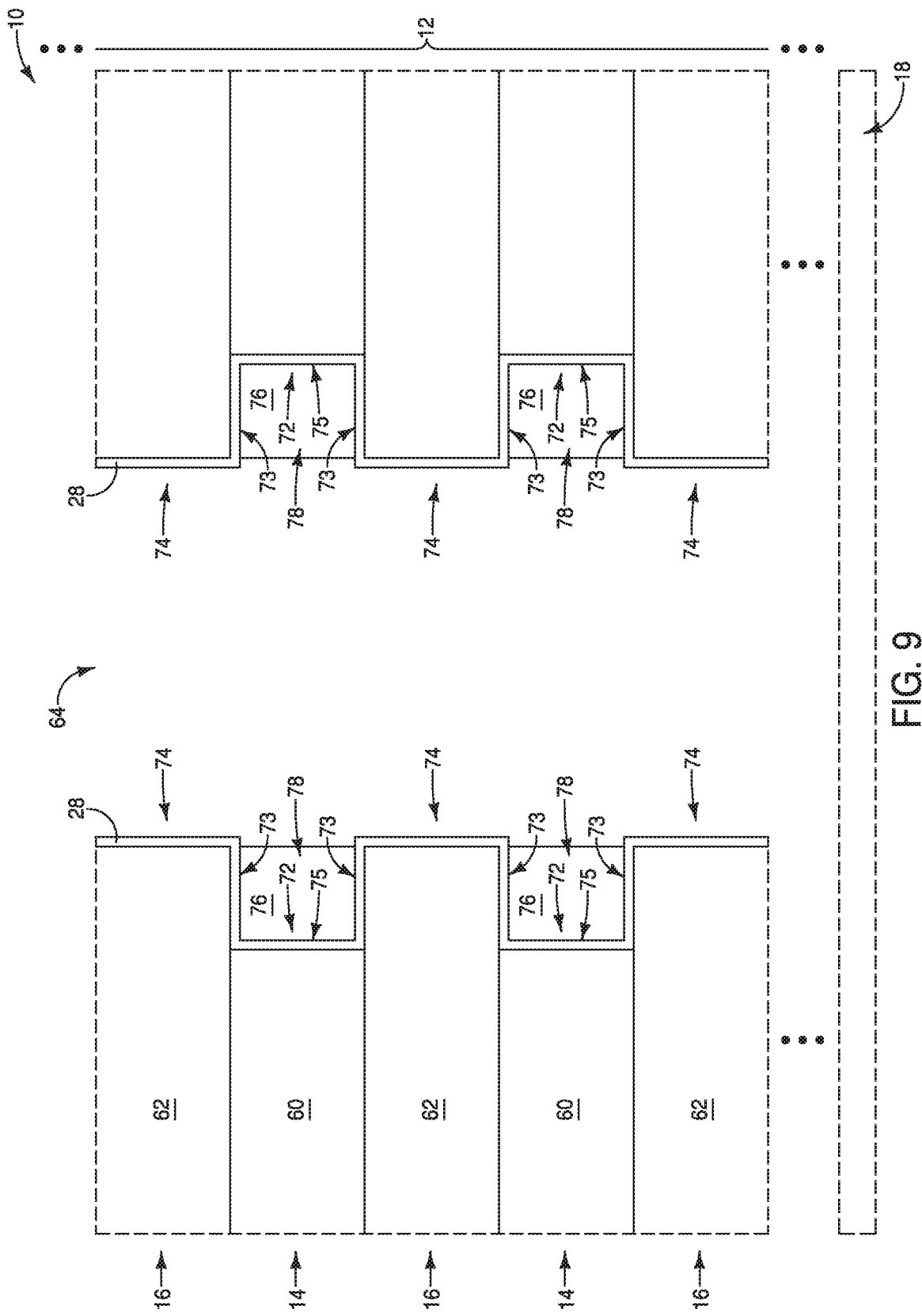

Referring to FIG. 9, sacrificial material 76 is formed within the cavities 68 (FIG. 8), and is patterned into plugs 78. The sacrificial material 76 may comprise any suitable composition(s); and in some embodiments may comprise, consist essentially of, or consist of polycrystalline silicon.

The sacrificial material plugs 78 are adjacent to the first portions 72 of the high-k dielectric material 28.

Figure 10:
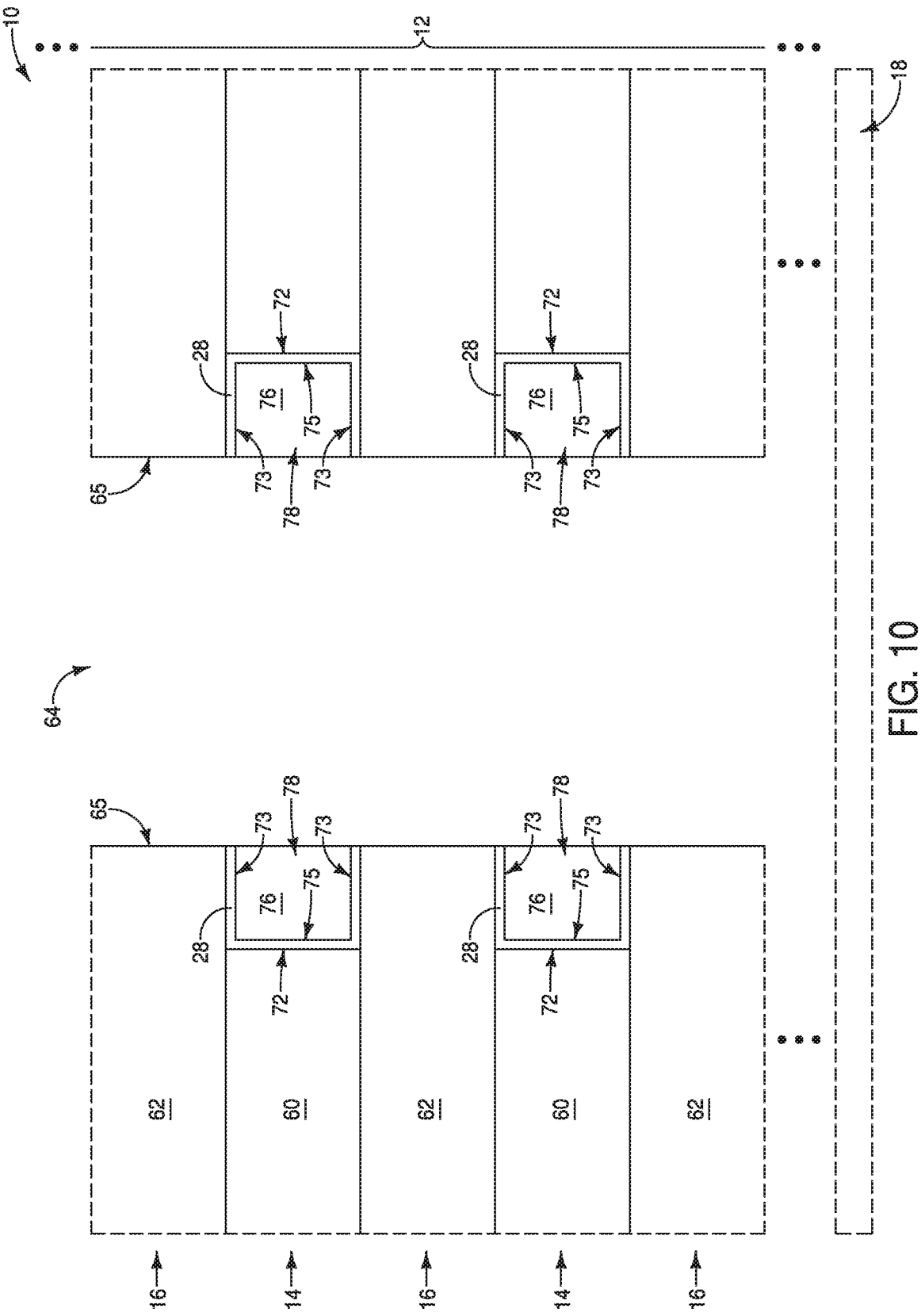

Referring to FIG. 10, the second portions 74 (FIG. 9) of the high-k dielectric material 28 are removed to form substantially straight peripheral sidewalls 65 of the opening 64. The term "substantially straight" means straight to within reasonable tolerances of fabrication and measurement. The cross-sectional view of FIG. 10 appears to show a pair of the peripheral sidewalls 65 which are on opposing sides of the opening 64 relative to one another. However, as described above with reference to FIGS. 6 and 6A, the opening 64 may have a closed shape when viewed from above. Accordingly, the apparent pair of sidewalls 65 along the cross-section of FIG. 10 may be comprised by a single continuous sidewall.

The substantially straight peripheral sidewall 65 of FIG. 10 extends along the second material 62, the high-k dielectric material 28 and the sacrificial material plugs 78.

Figure 11:
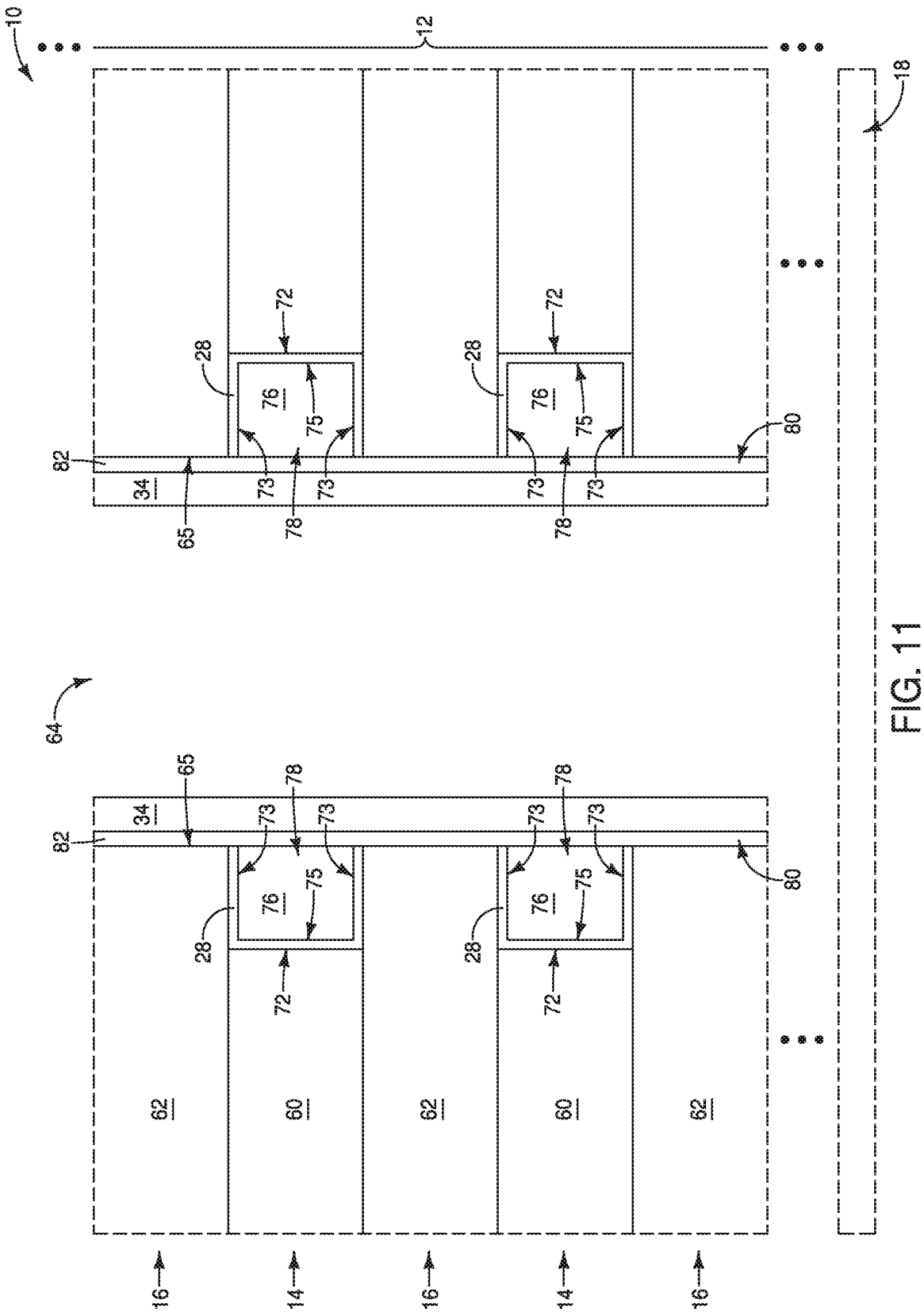

Referring to FIG. 11, a layer 80 is formed along the substantially straight peripheral sidewall 65. The layer 80 comprises a material 82. The layer material 82 may comprise any suitable composition(s); and in some embodiments may comprise, consist essentially of, or consist of polycrystalline silicon.

A charge-blocking material 34 is formed adjacent the layer 80. The charge-blocking material 34 may comprise any suitable composition(s); and in some embodiments may comprise, consist essentially of, or consist of one or both of silicon oxynitride (SiON) and silicon dioxide ($SiO_2$). The charge-blocking material 34 may be formed by oxidizing a portion of the layer 80 and/or by deposition (e.g., atomic layer deposition, chemical vapor deposition, etc.) of at least some of the material 34 over the layer 80. In some embodiments, the layer 80 may be omitted, and the oxide 34 may be provided directly against the substantially straight peripheral sidewall 65.

The charge-blocking material 34 has a substantially opography at the process stage of FIG. 11.

Figure 12:
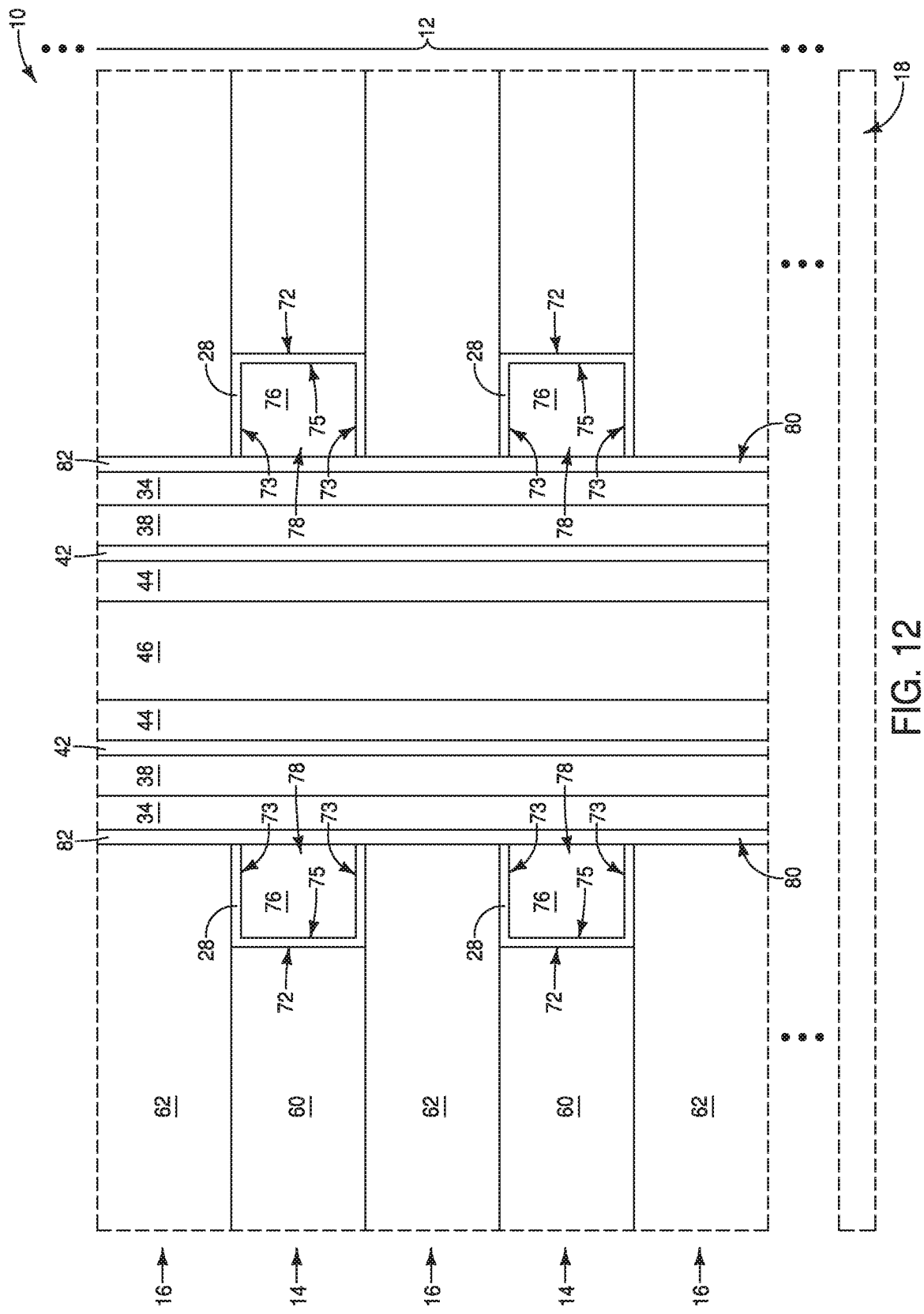

Referring to FIG. 12, charge-storage material 38 is formed adjacent the charge-blocking material 34. The charge-storage material 38 may comprise any suitable composition(s). In some embodiments the charge-storage material 38 may comprise charge-trapping materials; such as, for example, silicon nitride, silicon oxynitride, conductive nanodots, etc, For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

The charge-storage material 38 is formed along the flat topography of the charge-blocking material 34, and has a flat configuration in the illustrated embodiment of FIG. 12. The term "flat configuration" means that the material 38 is of substantially continuous thickness and extends substantially vertically straight, as opposed to being undulating.

Gate-dielectric material (i.e., tunneling material, charge-passage material) 42 is formed adjacent the charge-storage material 38. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties; and accordingly may comprise a combination of two or more different materials.

Channel material 44 is formed adjacent the gate-dielectric material 42, and extends vertically along the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 46 is formed adjacent the channel material 44, and fills a remaining portion of the opening 64 (FIG. 11). The insulative material 46 may comprise any suitable composition(s); and in some embodiments may comprise, consist essentially of, or consist of silicon dioxide.

In the illustrated embodiment of FIG. 12, the channel material 44 is configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

Figure 13:
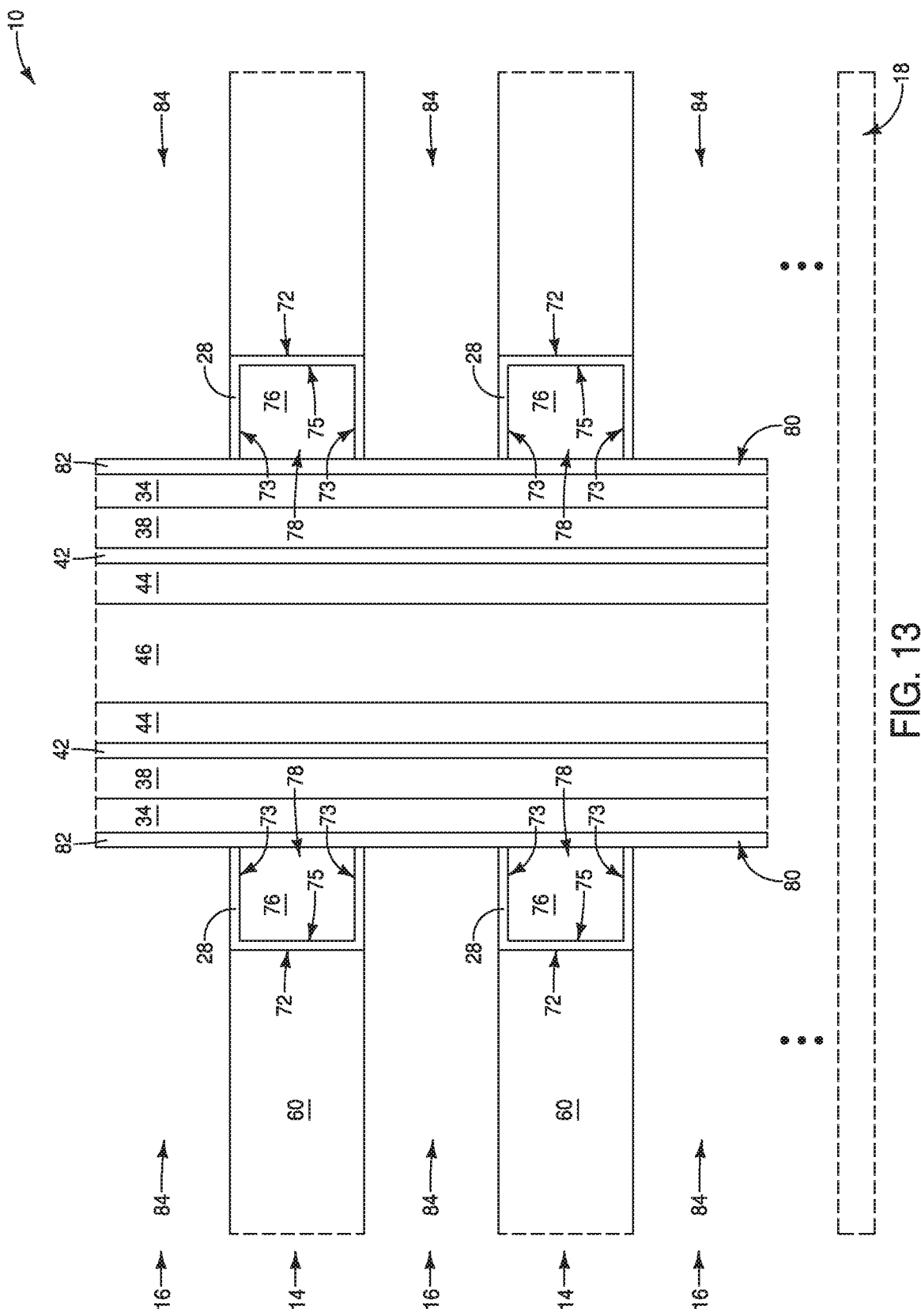

Referring to FIG. 13, the second material 62 (FIG. 12) is removed to leave voids 84. The voids 84 may be referred to as first voids. Regions of the layer 80 are exposed by the voids 84.

Figure 14:
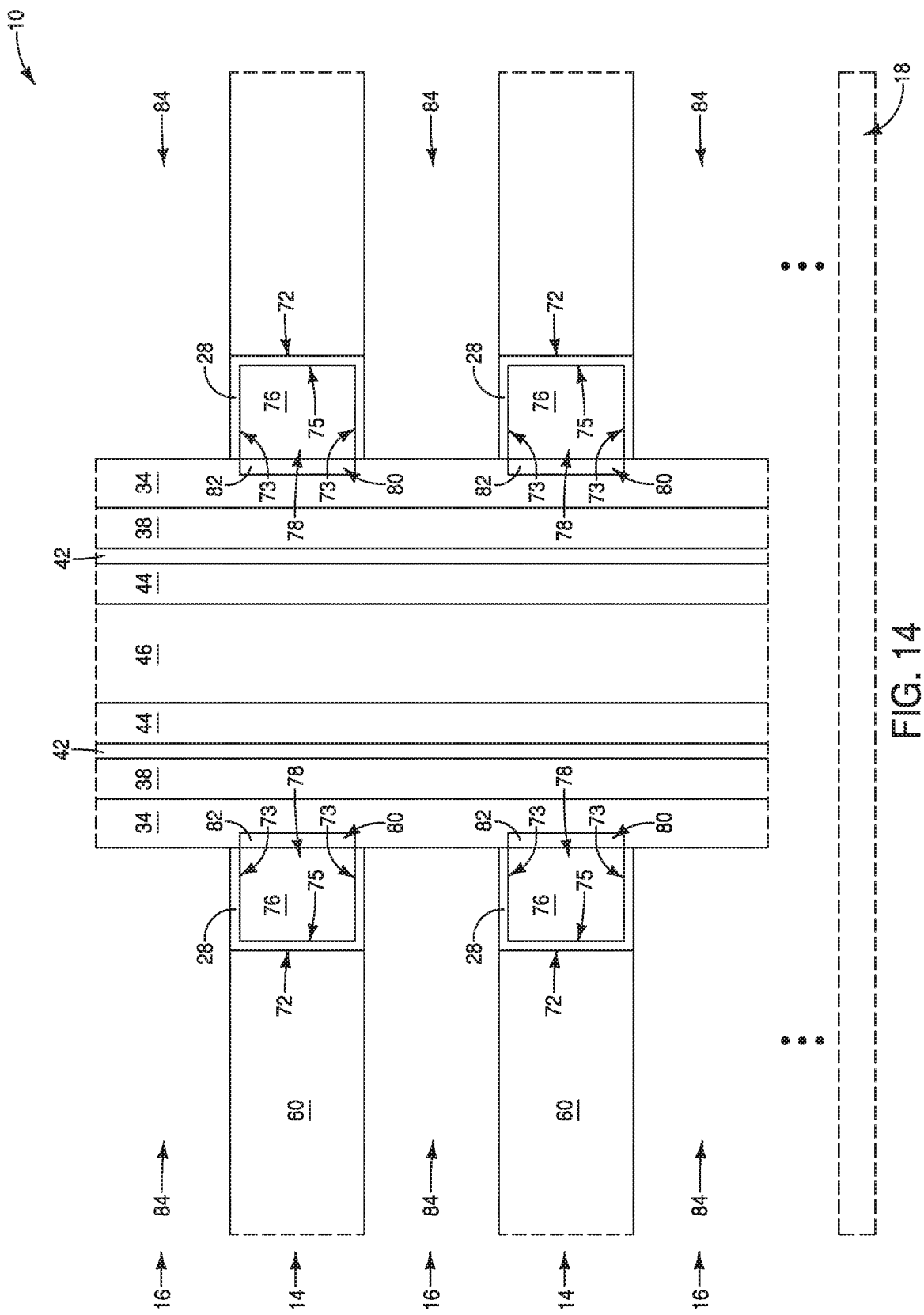

Referring to FIG. 14, the exposed regions of the layer 80 are converted into additional charge-blocking material 34 (accordingly, the charge-blocking material 34 is laterally expanded at the process stage of FIG. 14 as compared to the process stage of FIG. 13). The conversion of the layer 80 into the charge-blocking material 34 may comprise oxidation of regions of the layer material 82.

In the illustrated embodiment of 14, only portions of the layer 80 are oxidized and other portions of the layer 80 remain adjacent the sacrificial material plugs 78. In some embodiments, the oxidation of the layer 80 may extend may consume the entirety of the layer 80 so that the layer 80 is entirely absent at the process stage of FIG. 14.

Figure 15:
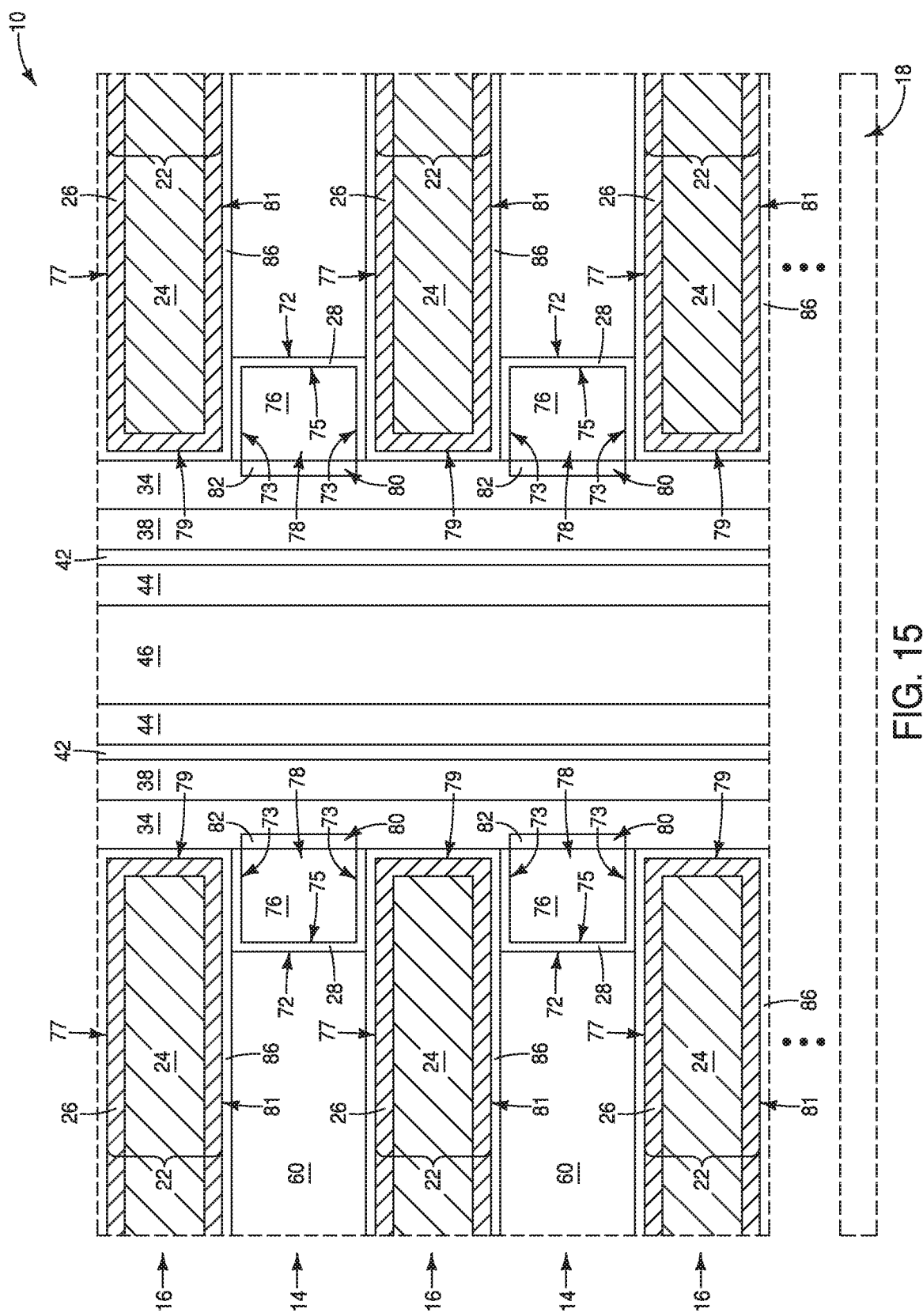

Referring to FIG. 15, high-k dielectric material 86 is formed within the first voids 84 (FIG. 14) to line the first voids, and then conductive regions 22 are formed within the lined voids. The high-k dielectric material 86 may be referred to as a second high-k dielectric material to distinguish it from the first high-k dielectric material 28. The high-k dielectric material 86 may also be referred to as dielectric-barrier material.

The high-k dielectric material 86 may comprise a same composition as the high-k dielectric material 28, or may comprise a different composition relative to the high-k dielectric material 28. In some embodiments, the high-k dielectric material 86 may comprise, consist essentially of, or consist of one or more of aluminum oxide, hafnium oxide, hafnium silicate, zirconium oxide and zirconium silicate. In some embodiments, the first and second high-k dielectric materials 28 and 86 may both comprise, consist essentially of, or consist of aluminum oxide.

The high-k dielectric material 86 has a substantially uniform thickness along the interior peripheries of the voids 84 (FIG. 14), with the term "substantially uniform" meaning uniform to within reasonable tolerances of fabrication and measurement. The high-k dielectric material 86 may he formed to any suitable thickness; and in some embodiments may be formed to a thickness within a range of from about 1 nm to about 6 nm.

The conductive regions 22 may comprise two or more conductive materials; and in the shown embodiment comprise a pair of conductive materials 24 and 26. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. in some embodiments the core material 24 may comprise one or more metals (e.g., may comprise tungsten), and the outer conductive material26 may comprise one or more metal nitrides (e.g., may comprise titanium nitride).

In the shown embodiment, the high-k dielectric material 86 is directly against the conductive material 26.

The conductive regions 22 have front surfaces 79 facing the vertically-extending materials 34, 38, 42 and 44. The conductive regions 22 also have upper surfaces (top surfaces) 77 and lower surfaces (i.e., bottom surfaces) 81 which extend back from the front surfaces 79.

In some embodiments, the levels 16 may be considered to be conductive levels at the process stage of FIG. 15, with such conductive levels comprising the conductive regions 22.

Figure 16:
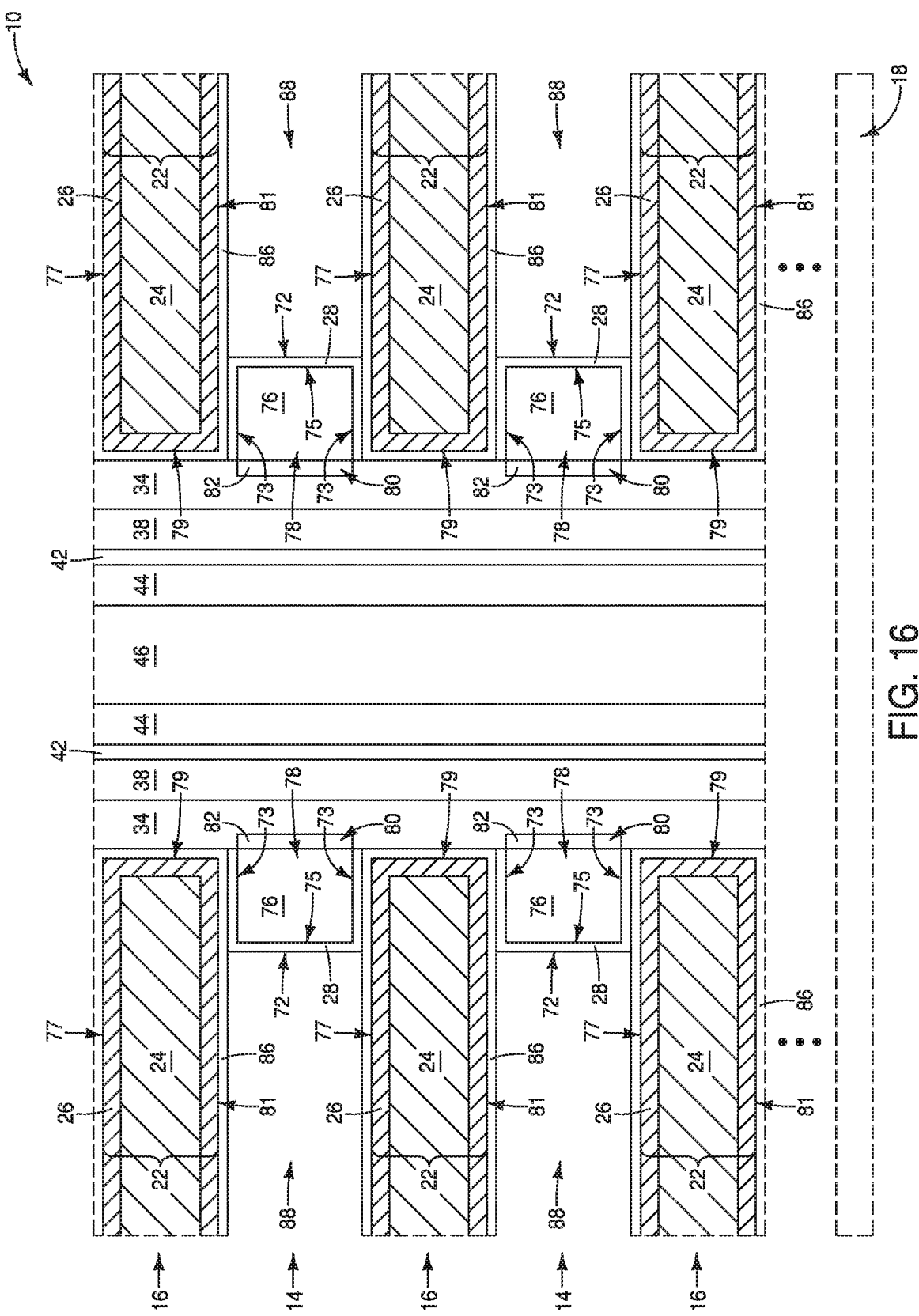

Referring to FIG. 16, the first material 60 (FIG. 15) is removed to form second voids 88.

Figure 17:
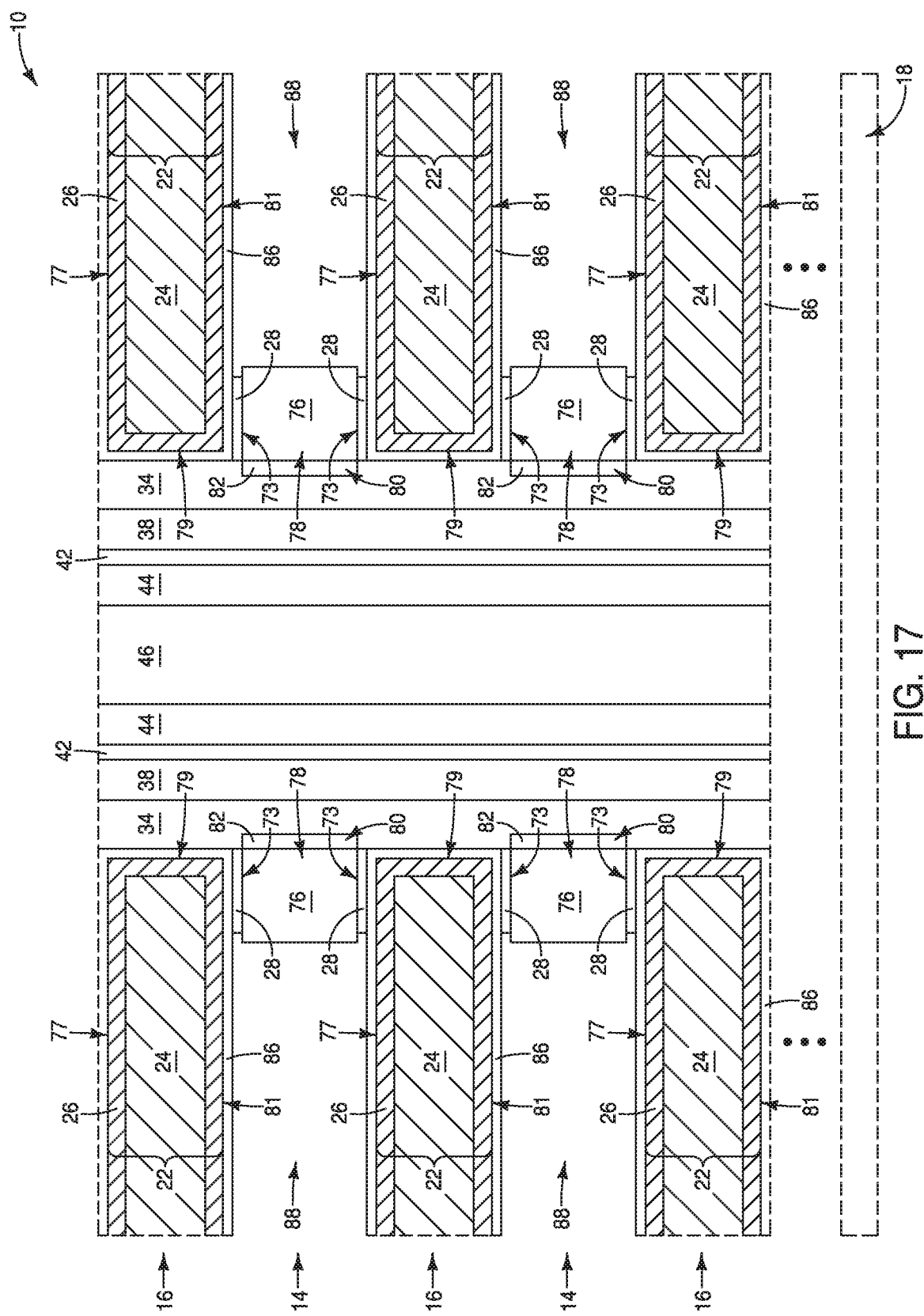

Referring to FIG. 17, the second voids 88 are extended through the substantially vertical segments 75 (FIG. 16) of the first portions 72 (FIG. 16) of the first high-k dielectric material 28 to expose the sacrificial material plugs 78.

Figure 18:
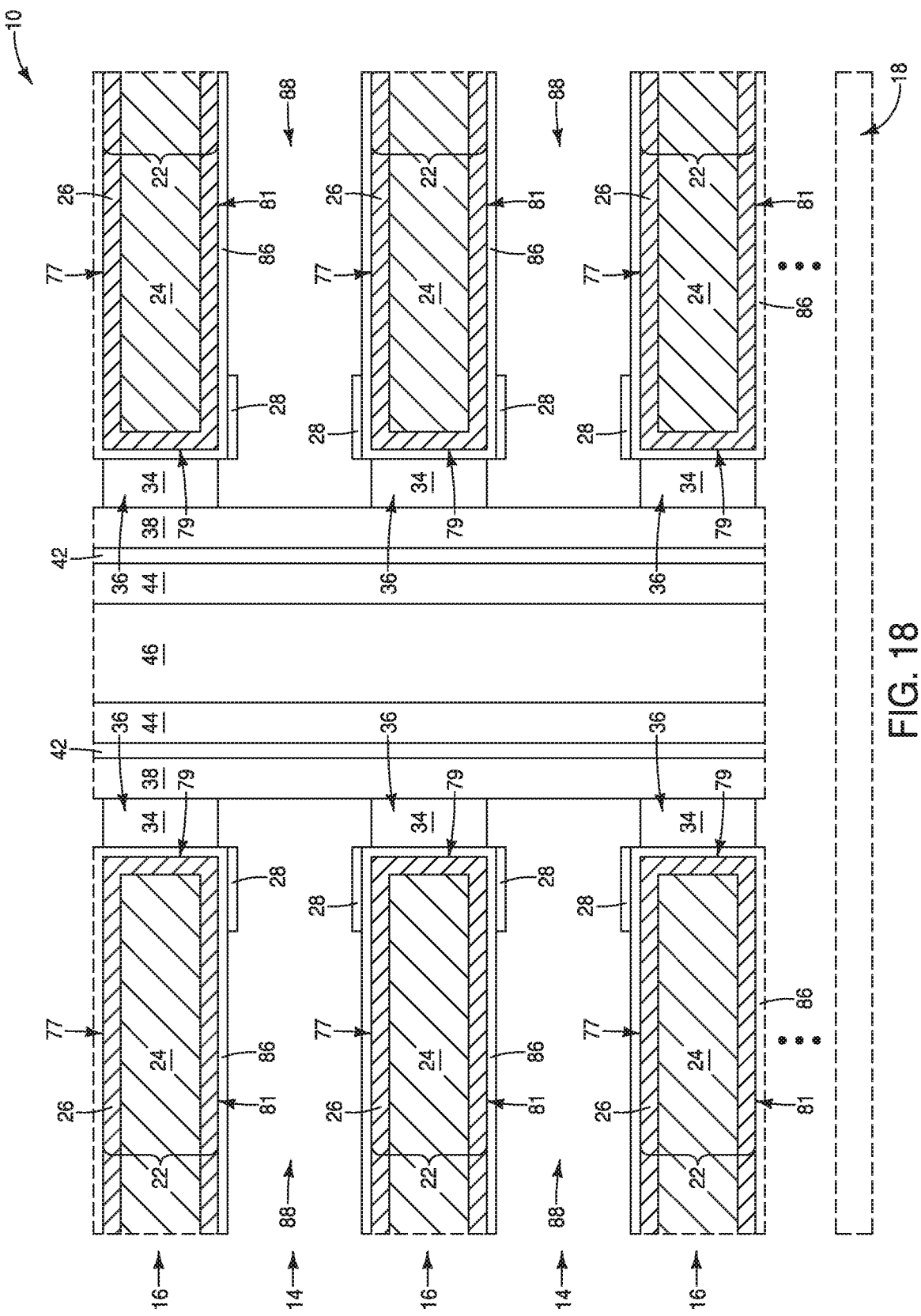

Referring to FIG. 18, the second voids 88 are extended through the sacrificial material plugs 78 (FIG. 17), through the remaining portions of the material 82 (i.e., through the non-oxidized regions of the layer 80 that are shown in FIG. 17), and through regions of the charge-blocking material 34. The extended voids 88 divide the charge-blocking material 34 into vertically-spaced segments 36.

Figure 19:
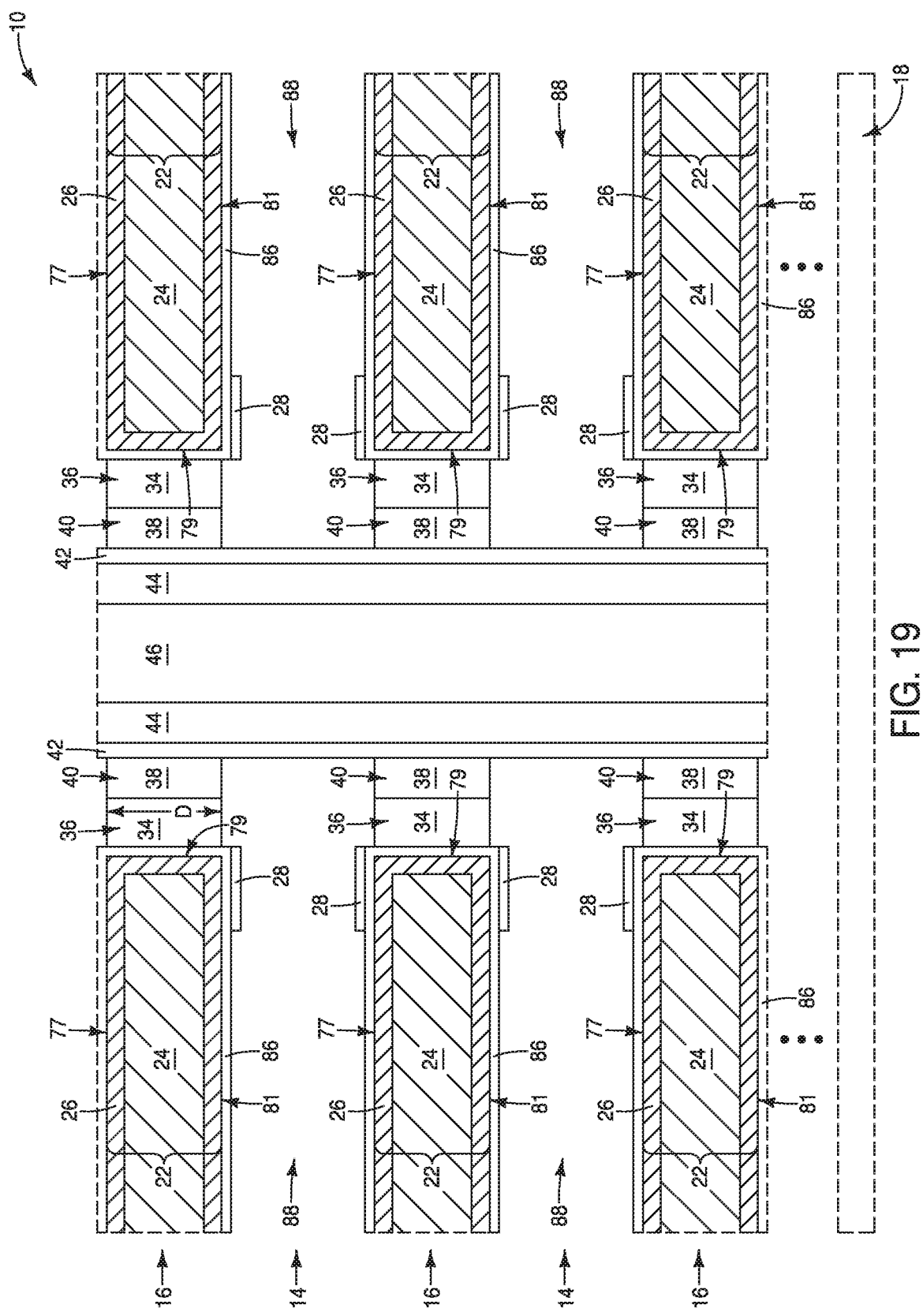

Referring to FIG. 19, the second voids 88 are extended through the charge-storage material 38 to divide the charge-storage material into vertically-spaced segments 40. In some embodiments, the segments 36 of the charge-blocking material 34 may be referred to as first segments, and the segments 40 of the charge-storage material 38 may be referred to as second segments.

The illustrated embodiment has the second voids 88 terminating at the gate-dielectric material 42. In other embodiments, the second voids may punch through the gate dielectric material.

In the illustrated embodiment of FIG. 19, the segments 36 and 40 have substantially flat configurations. Also, the channel material 44 has a substantially flat configuration. The flat channel material may positively impact string current as compared to non-flat configurations. Also, the flat segments 40 of the charge-storage material may have a favorable charge-distribution.

In the embodiment of FIG. 19, the first and second segments 36 and 40 have about the same vertical dimension D as one another (with "about the same" meaning the same to within reasonable tolerances of fabrication and measurement). In other embodiments, the first and second segments 36 and 40 may have different vertical dimensions relative to one another.

Figure 20:
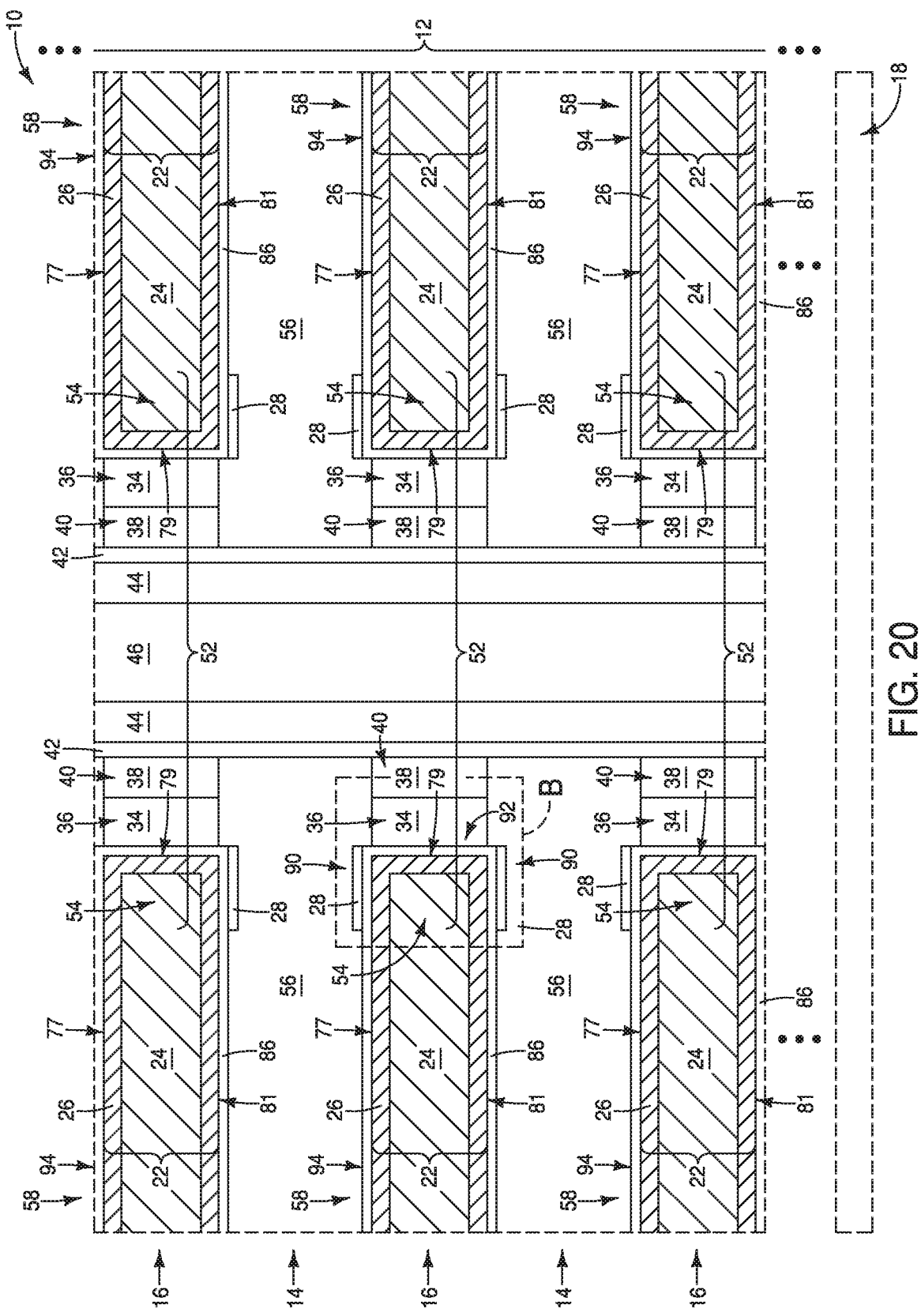

Referring to FIG. 20, insulative material 56 is formed within the second voids 88 (FIG. 19). The insulative material 56 may comprise any suitable composition(s); and in some embodiments may comprise, consist essentially of, or consist of silicon dioxide. In the illustrated embodiment of FIG. 19, the insulative material 56 entirely fills the second voids 82 (FIG. 18).

The integrated assembly 10 of FIG. 20 may be considered to comprise a stack of alternating insulative levels 14 and conductive levels 16.

The conductive levels 16 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels. 1024 memory cell levels, etc. The vertical stack 12 is indicated to extend vertically beyond the illustrated region to show that there may be more vertically-stacked levels than those specifically illustrated in the diagram of FIG. 20.

NAND memory cells 52 comprise the dielectric barrier material 86, charge-blocking material 34, charge-storage material 38, gate-dielectric material 42 and channel material 44. The illustrated NAND memory cells 52 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 52 includes a control gate region (or terminal region) 54 within a conductive level 16. The control gate regions 54 comprise control gates analogous to those described above with reference to FIGS. 1-4. The conductive levels 16 comprise regions 58 adjacent to, or proximate, the control gate regions 54. The regions 58 may be referred to as second regions, distal regions, non-terminal regions, or wordline regions.

The conductive regions 22 include the top and bottom surfaces 77 and 81, with such surfaces extending along the control gate regions (terminal regions) 54, and along the distal regions (nonterminal regions) 58. The conductive regions 22 also include the front surfaces (which may be referred to as vertically-extending sidewall surfaces) 79 between the top surfaces 77 and the bottom surfaces 81.

The high-k dielectric materials 86 and 28 may he together considered to be a high-k material 86/28 which wraps around the terminal regions 54. First regions 90 of the high-k dielectric material 86/28 are along the top and bottom surfaces 77 and 81 of the teiniinal regions 54, and such first regions comprise a laminate stack of the first high-k dielectric material 28 over the second high-k dielectric material 86. Second regions 92 of the high-k dielectric material 86/28 are along the front surfaces (i.e., the vertically-extending sidewall surfaces) 79 of the terminal regions 54, and such second regions only comprise the second high-k dielectric material 86. Accordingly, the second regions 92 of the high-k dielectric material 86/28 are thinner than the first regions 90 of the high-k dielectric material 86/28. In some embodiments, the first regions 90 of the high-k dielectric material 86/28 may be at least about 20% thicker than the second regions 92 of the high-k dielectric material 86/28, at least about twice as thick as the second regions 92, at least about three-times as thick as the second regions 92, at least about four-times as thick as the second regions 92, etc. In sonic embodiments, the second regions 92 of the high-k dielectric material 86/28 have thicknesses within a range of from about 1 nm to about 6 nm, and the first regions 90 of the high-k dielectric material 86/28 have thicknesses within a range of from about 3 nm to about 12 nm, The high-k dielectric material 86/28 may be considered to have third regions 94 which extend along the distal portions (i.e., nonterminal portions) 58 of the wordline levels 16. The third regions 94 comprise only the high-k dielectric material 86. Accordingly, the third regions 94 of the high-k dielectric material 86/28 may be about the same thickness as the second regions 92 of the high-k dielectric material 86/28, and are thinner than the first regions 90 of the high-k dielectric material 86/28.

In some embodiments, the dielectric materials 28 and 86 may comprise a same composition as one another. Accordingly, the high-k dielectric material 86/28 may comprise a single homogeneous composition throughout the first, second and third regions 90, 92 and 94. In other embodiments, the dielectric materials 28 and 86 may comprise different compositions than one another. Accordingly, the high-k dielectric material 86/28 may comprise a first composition (the composition of the dielectric material 86) along the second regions 92 (i.e., along the front surfaces 79 of the terminal regions 54) and along the third regions 94; and may comprise a laminate configuration along the first regions 90. The laminate configuration includes a second composition (the composition of the dielectric material 28) over the first composition (the composition of the dielectric material 86).

Figure 21:
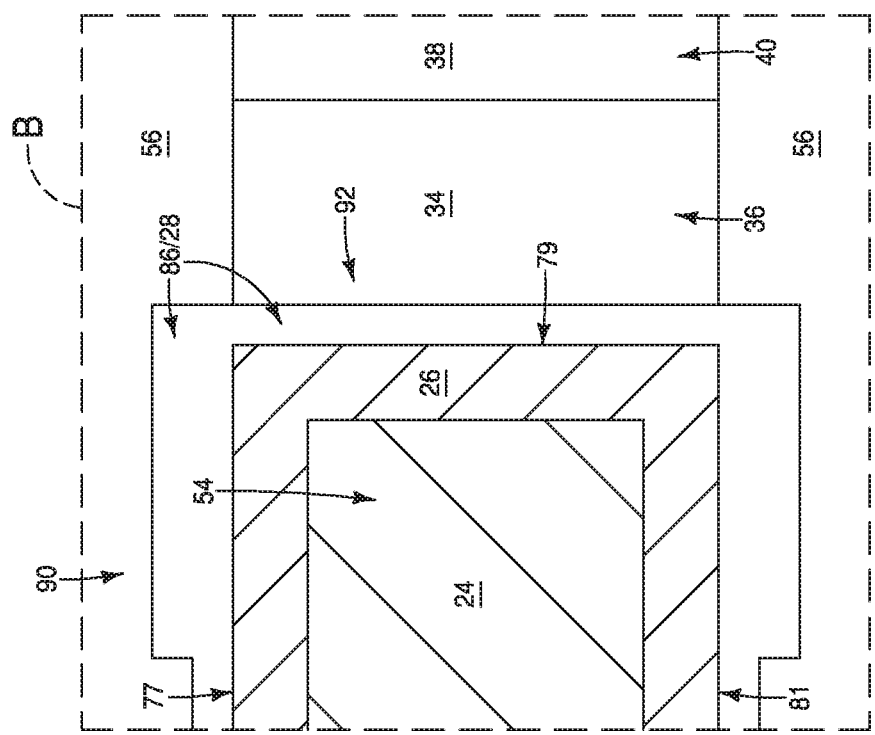
FIGS. 21 and 22 are enlarged views of a region "B" of FIG. 20 illustrating example arrangements of example structures.
Figure 22:
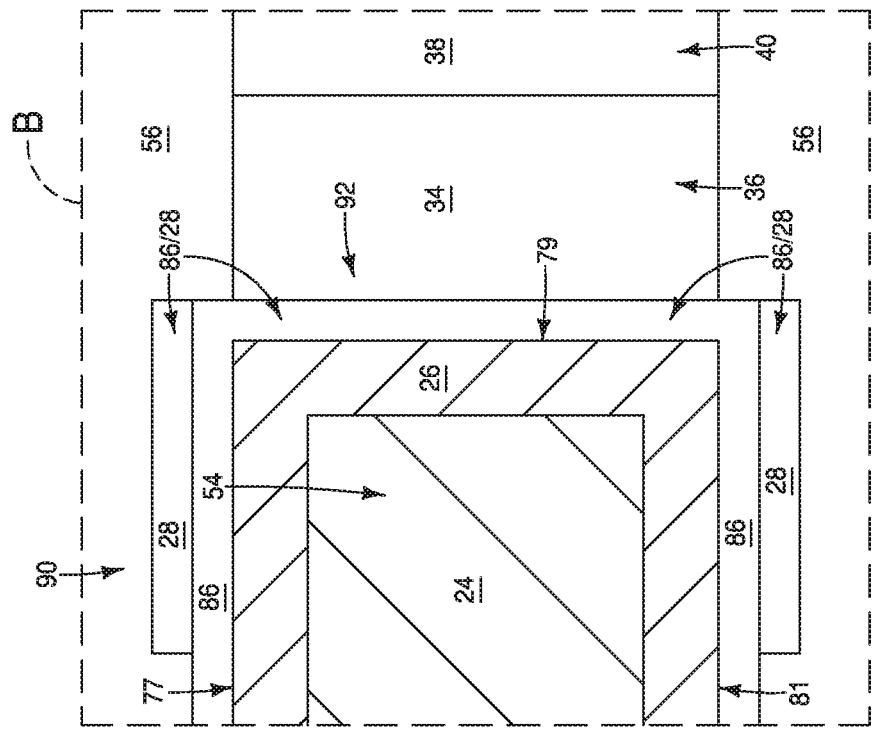

FIGS. 21 and 22 show enlarged views of a region "B" of FIG. 20 to better illustrate the high-k dielectric material 86/28. FIG. 21 shows a configuration in which the materials 28 and 86 comprise different compositions relative to one another, and FIG. 22 shows a configuration in which the materials 28 and 86 comprise the same composition as one another. In the embodiments of FIGS. 21 and 22, the segments 36 of the charge-blocking material 34 are directly against the second regions 92 of the high-k material 86/28.

Figure 23:
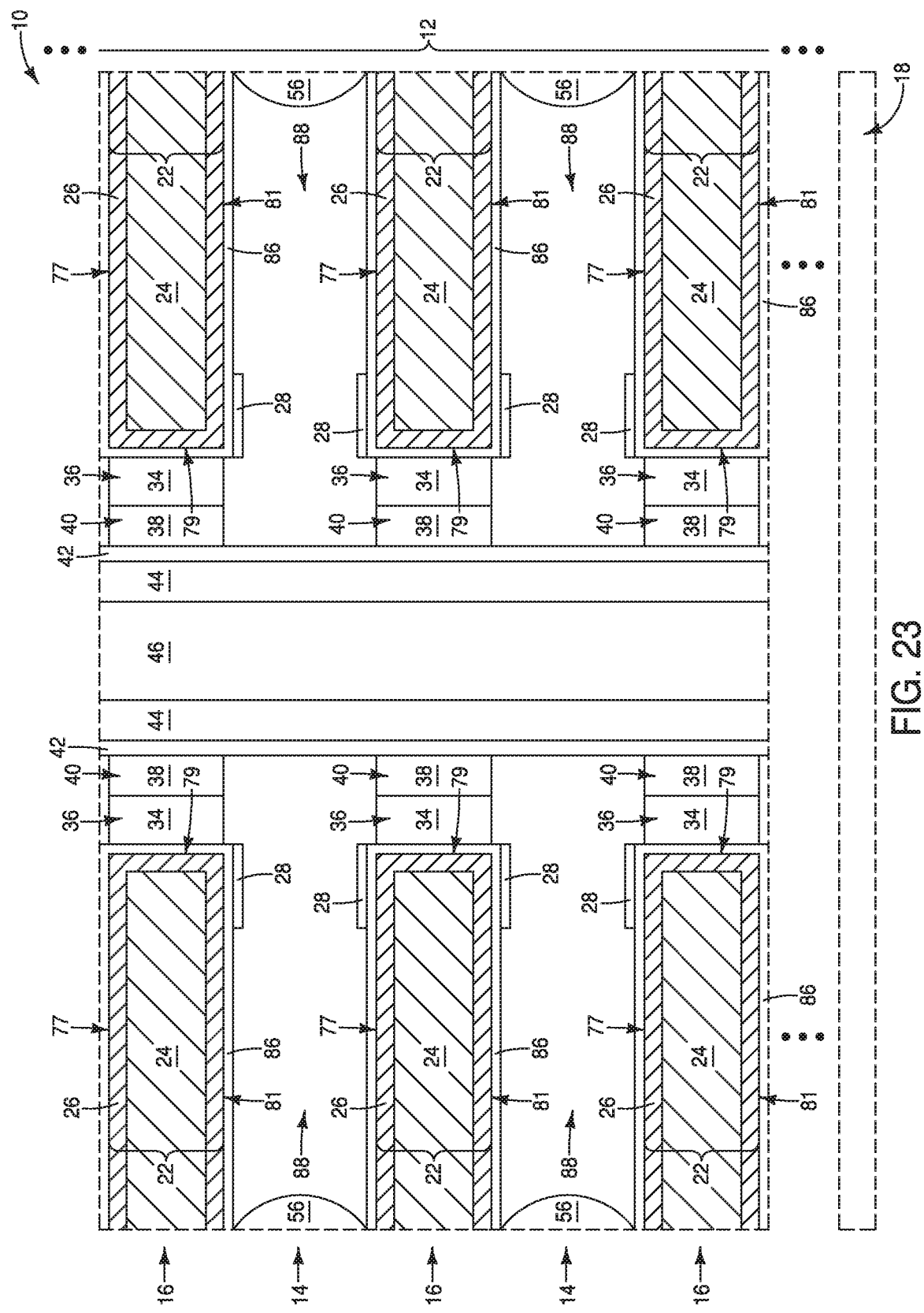
FIG. 23 is a diagrammatic cross-sectional side view of the region of the integrated assembly of FIG. 5 shown at an example process stage alternative to that of FIG. 20.

In the embodiment of FIG. 20, the insulative levels 14 are entirely filled with the insulative material 56. In other embodiments, portions of the voids 88 may remain within the insulative levels 14. For instance, FIG. 23 shows a configuration analogous to that of FIG. 20, but in which the voids 88 are only partially filled with the insulating material 56. Accordingly, portions of the voids 88 remain within the insulative levels 14. The remaining portions of the voids 88 are capped with the insulative material 56. The voids 88 may be filled with air or any other suitable gas.

An advantage of the configuration of FIG. 23 (i.e., a configuration having voids within the insulative levels 14) is that such may alleviate capacitive coupling between vertically-neighboring materials in the event that such capacitive coupling is found to be problematic.

Another example process for fabricating NAND memory cells is described with reference to FIGS. 24-35.

Figure 24:
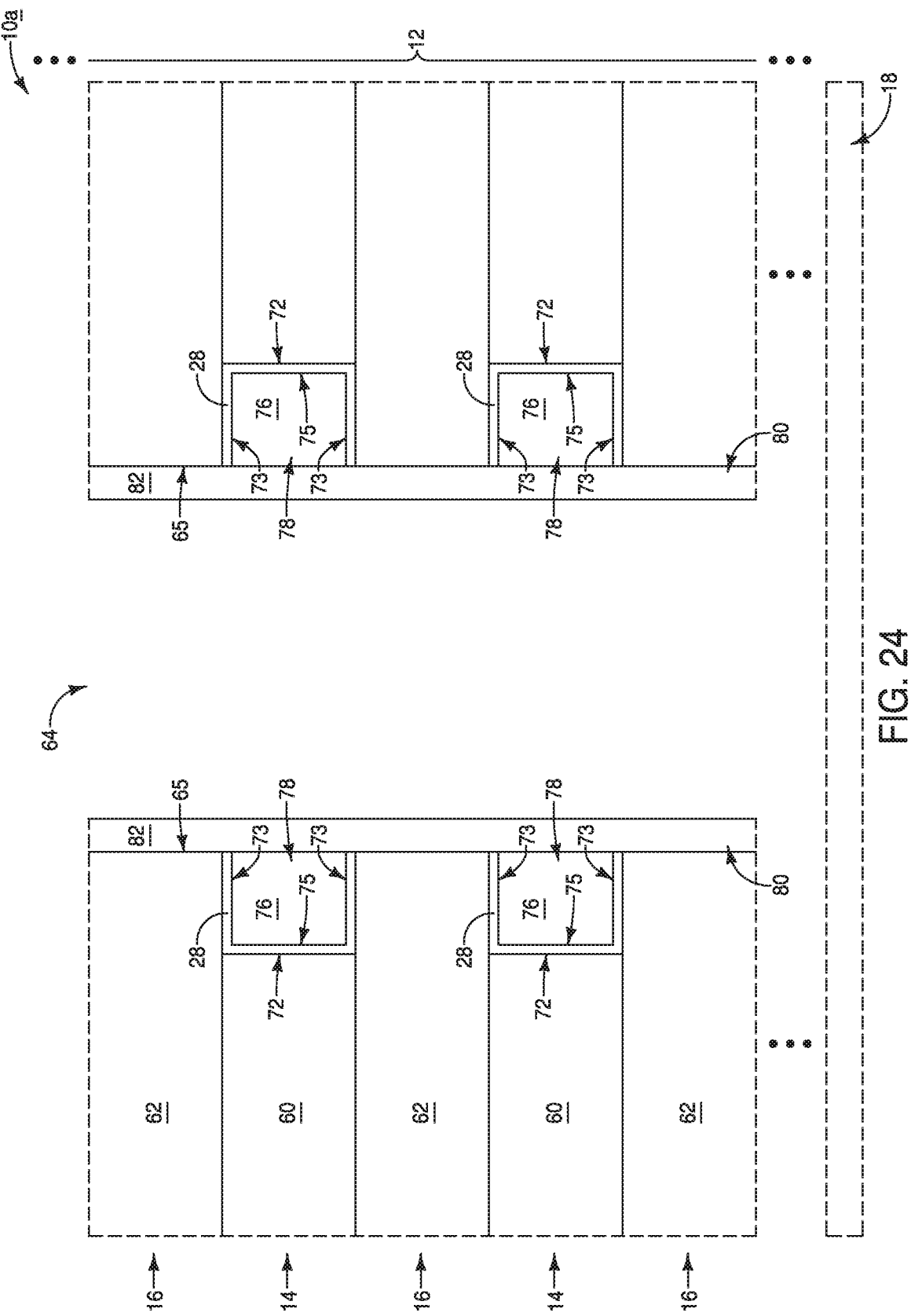
FIGS. 24-34 are diagrammatic cross-sectional side views of a region of an integrated assembly shown at example sequential process stages of an example method for thrming an example NAND memory array. The process stage of FIG. 24 may follow that of FIG. 10.

Referring to FIG. 24, such shows a construction (i.e., assembly) 10a at a process stage subsequent to that of FIG. 10, and alternative to that of FIG. 11. The layer 80 of material 82 is along the surfaces 65 of the opening 64, and the charge-blocking material 34 (FIG. 11) is omitted at the process stage of FIG. 24.

Figure 25:
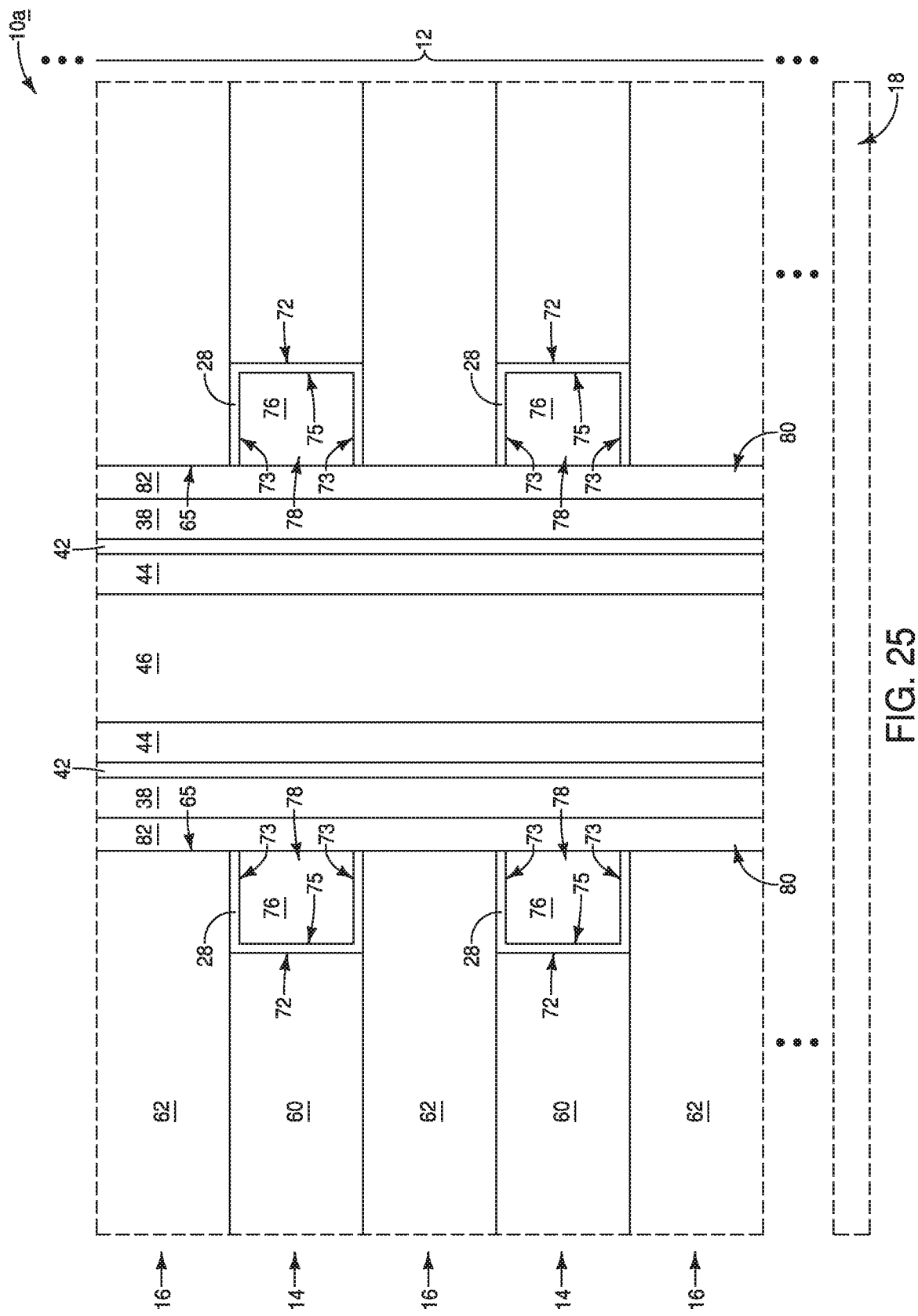

Referring to FIG. 25, the materials 38, 42, 44 and 46 are formed within the opening 64 (FIG. 24).

Figure 26:
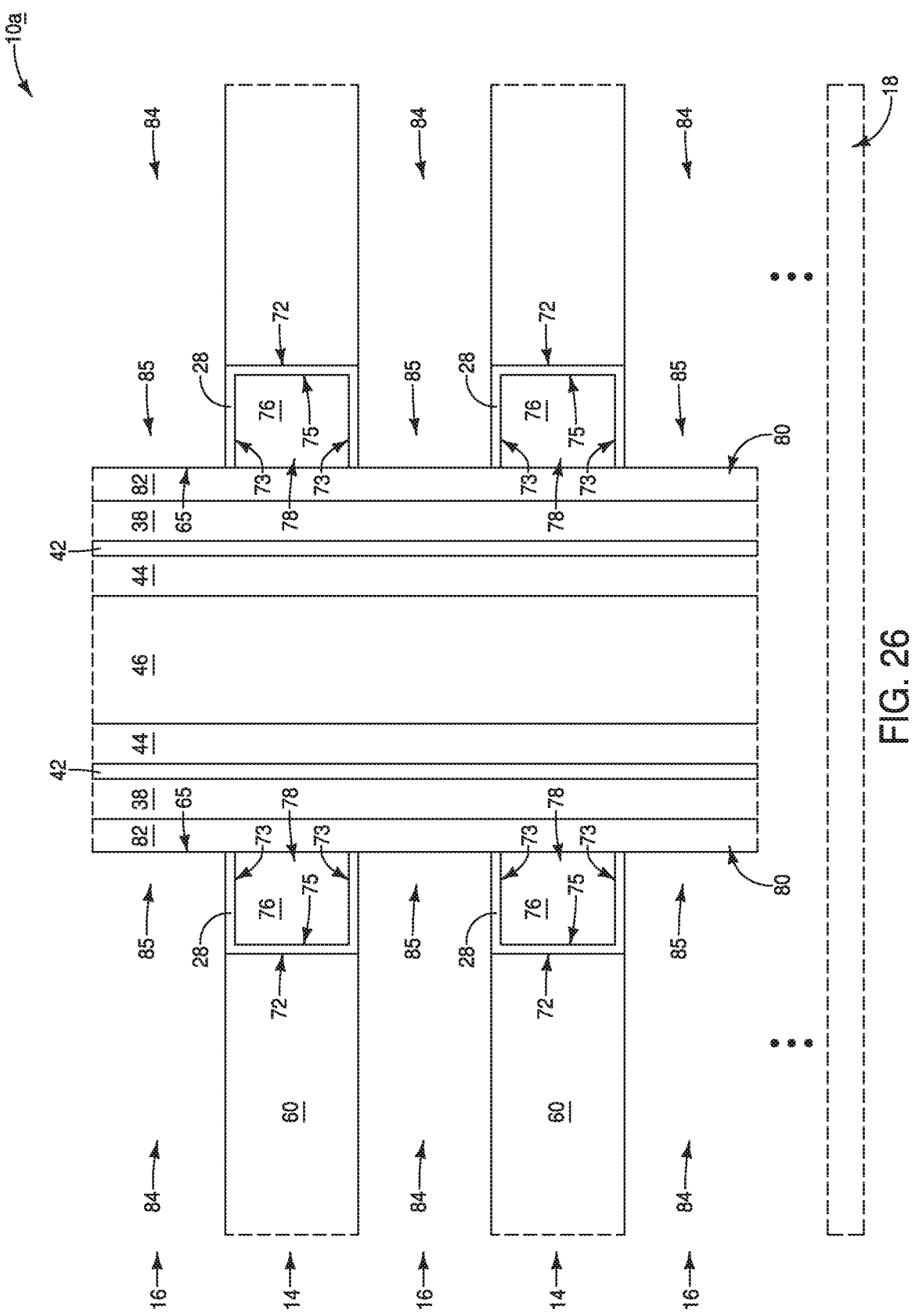

Referring to FIG. 26, the second material 62 (FIG. 25) is removed to form the first voids 84. Regions 85 of the material 82 of the layer 80 are exposed by the first voids 84.

Figure 27:
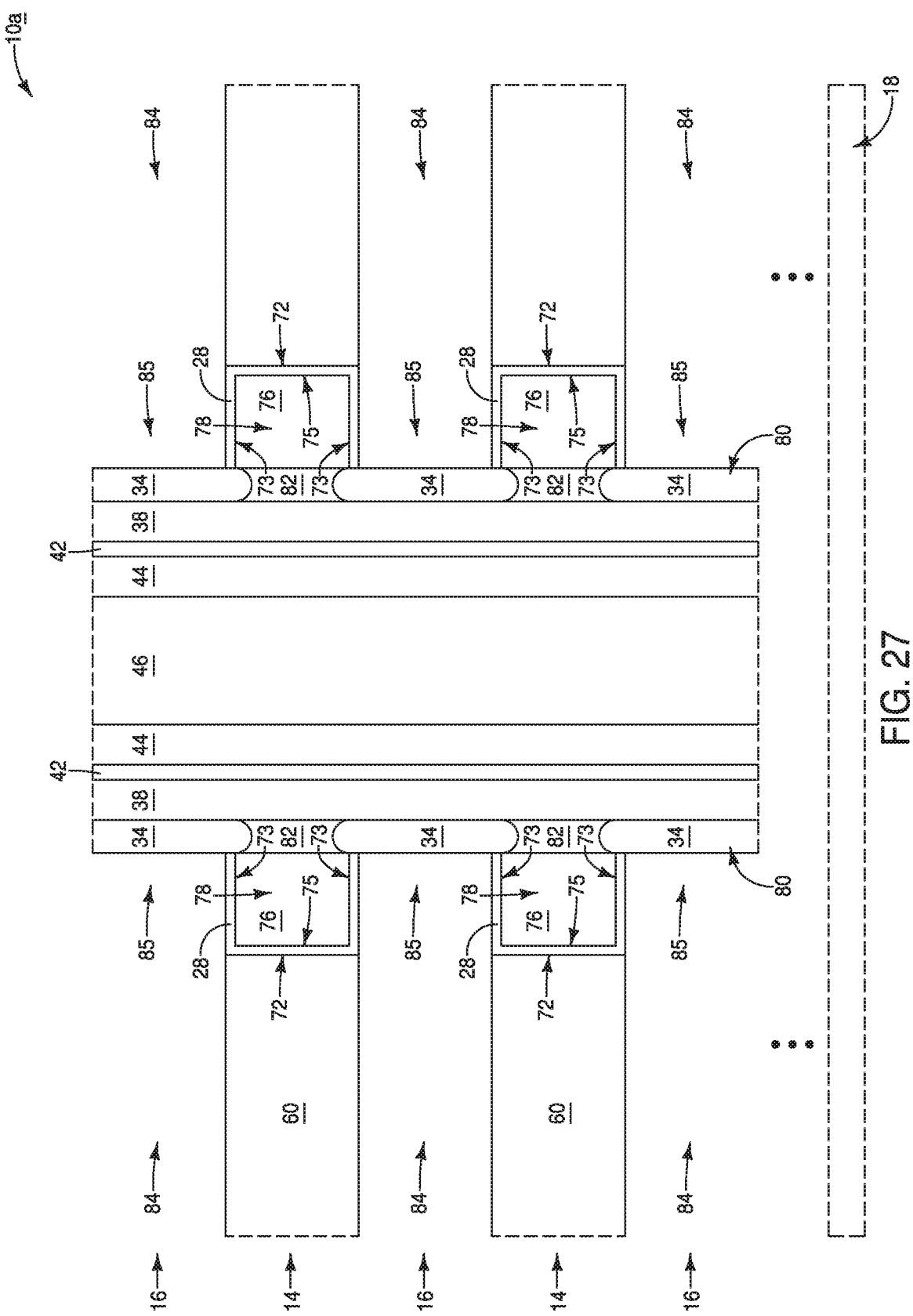

Referring to FIG. 27, the exposed regions 85 of the layer 80 are oxidized. In some embodiments, the material 82 of the layer 80 comprises silicon (e.g., polycrystalline silicon), and the oxidation of the exposed regions 85 forms silicon dioxide suitable for utilization as charge-blocking material 34.

Figure 28:
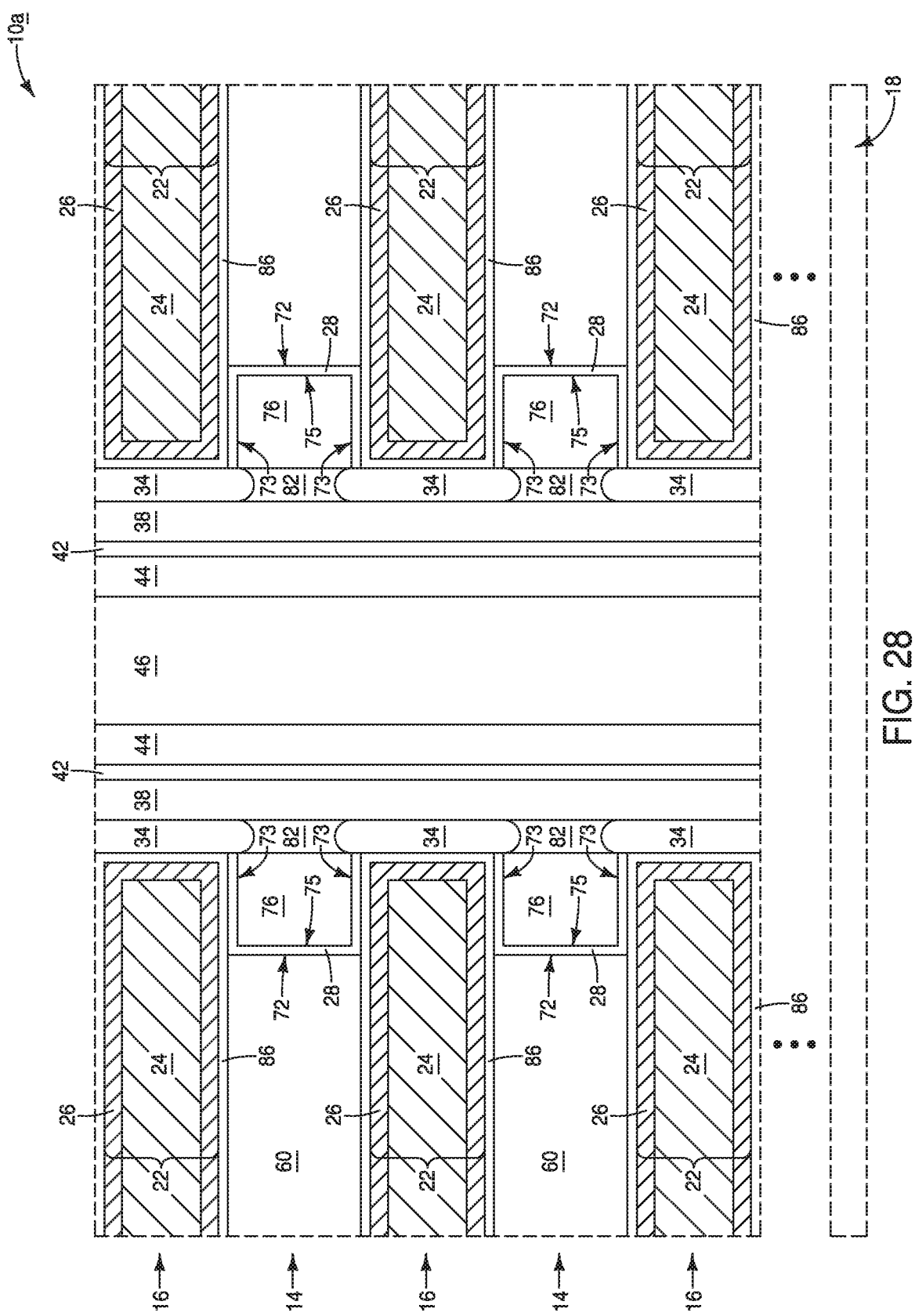

Referring to FIG. 28, the materials 86, 24 and 26 are formed within the voids 84 (FIG. 27).

Figure 29:
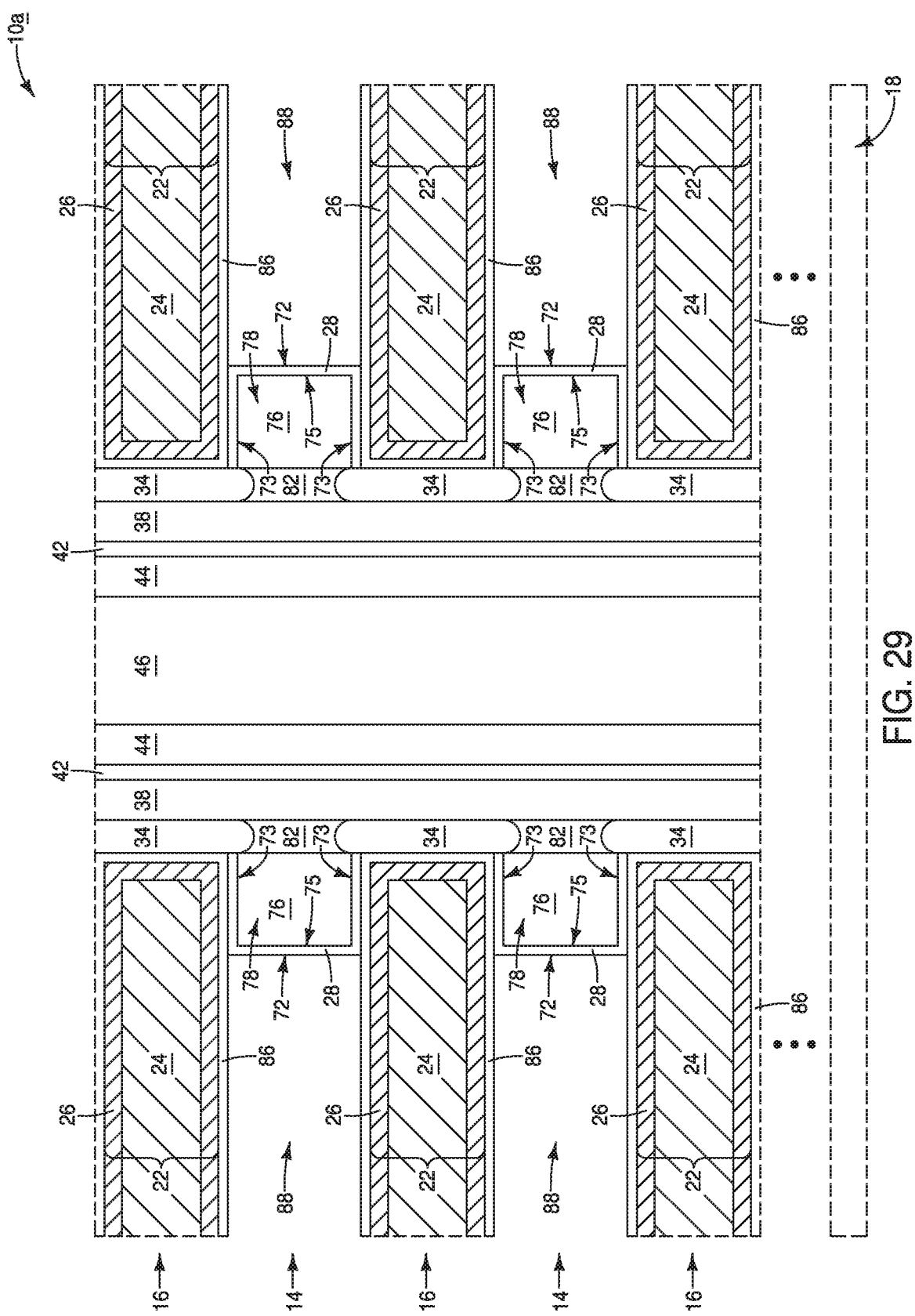

Referring to FIG. 29, the first material 60 (FIG. 28) is removed to form the second voids 88.

Figure 30:
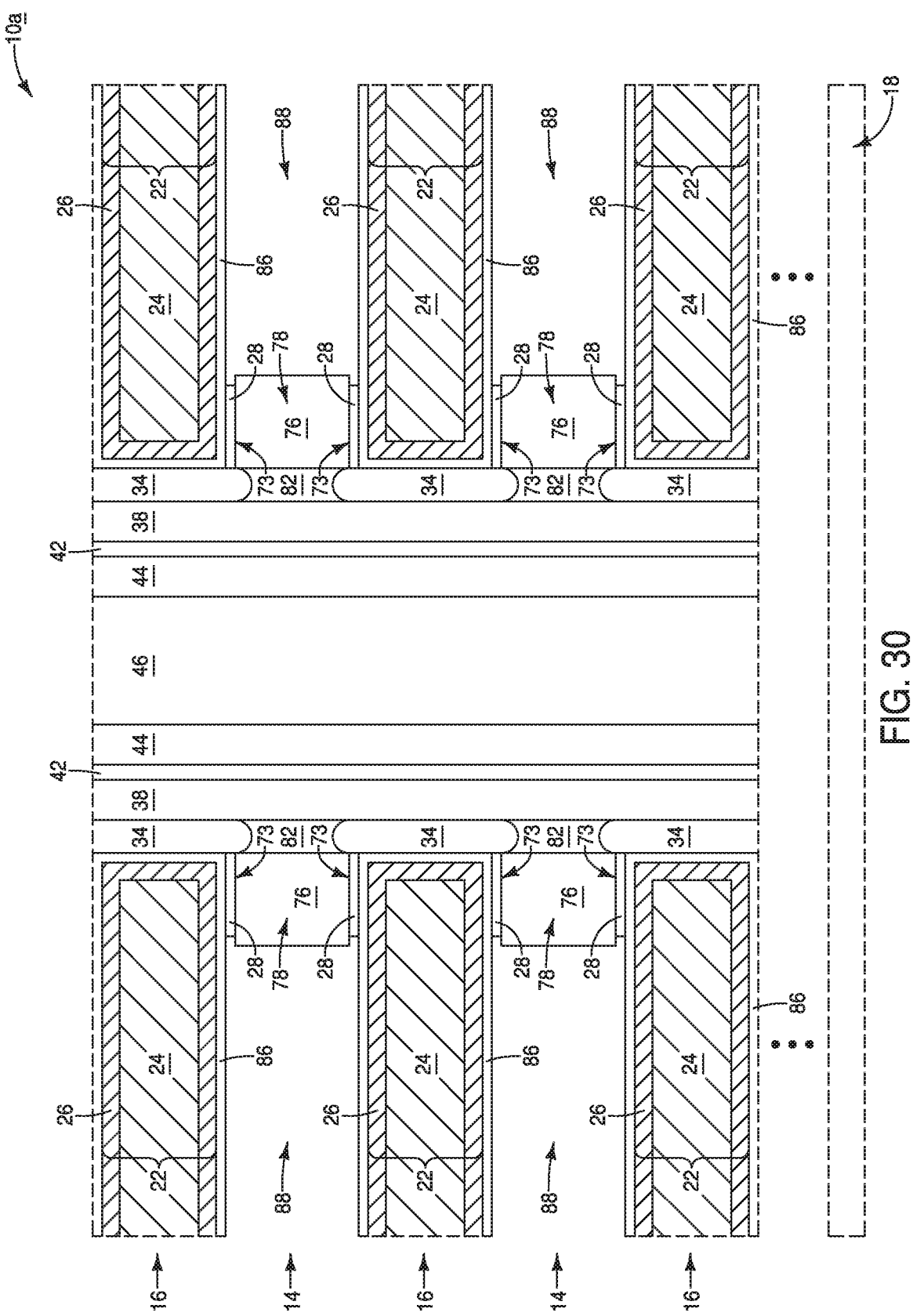

Referring to FIG. 30, the second voids 88 are extended through the substantially vertical segments 75 (FIG. 29) of the first portions 72 (FIG. 29) of the first high-k dielectric material 28 to expose the sacrificial material plugs 78.

Figure 31:
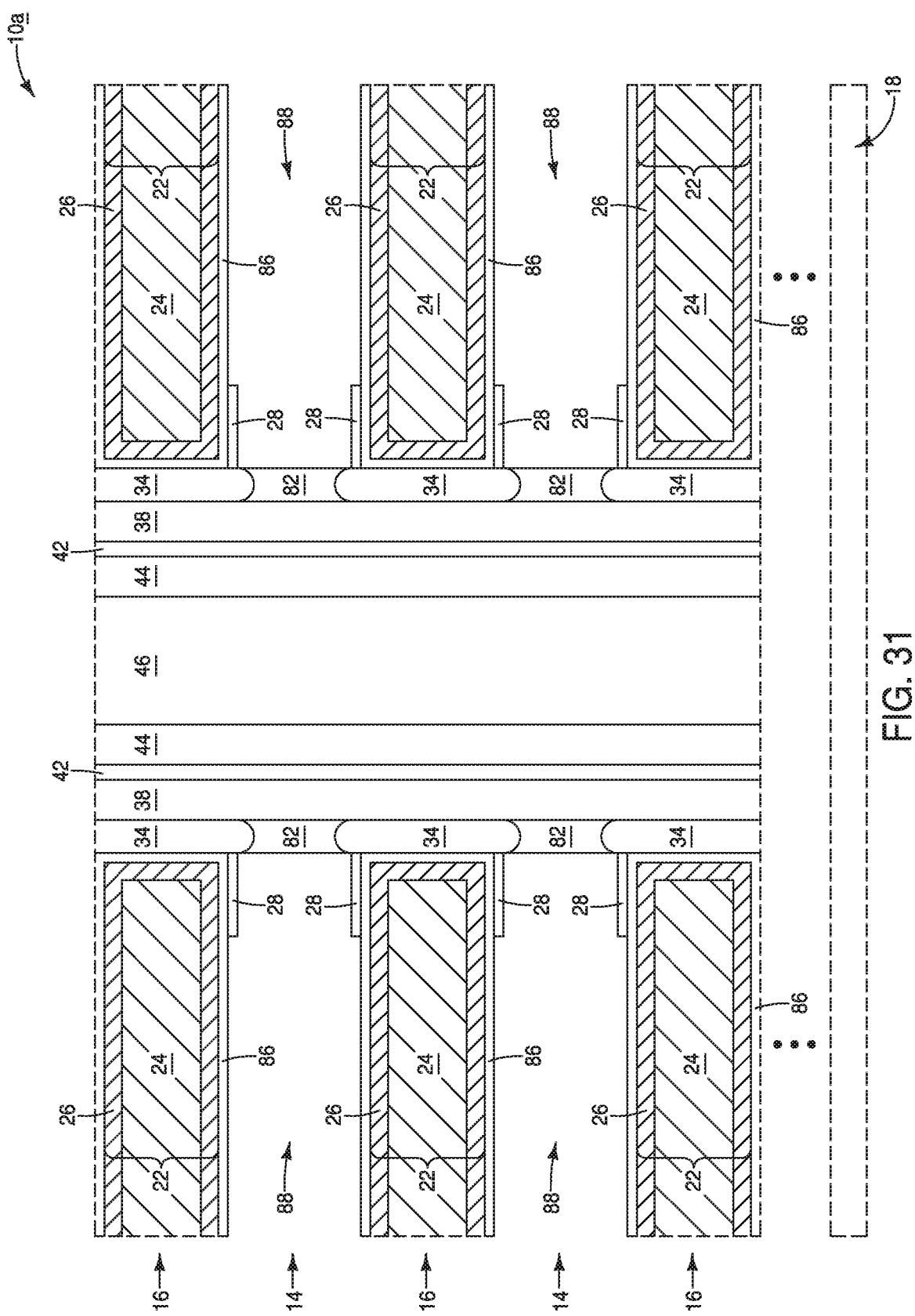

Referring to FIG. 31, the second voids 88 are extended through the sacrificial material plugs 78 (FIG. 30).

Figure 32:
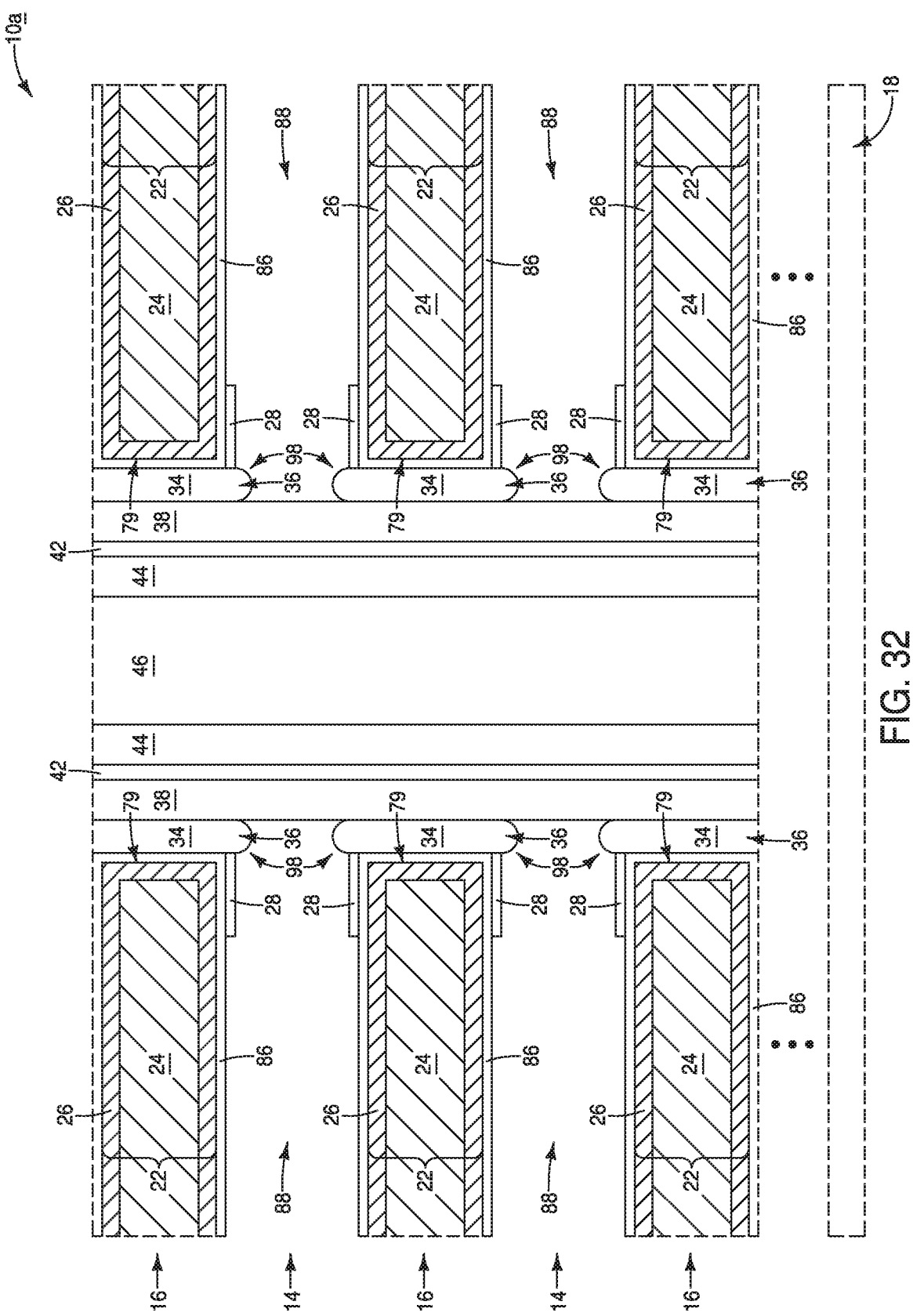

Referring to FIG. 32, the second voids 88 are extended through the material 82. The remaining charge-blocking material 34 is configured as the vertically-spaced segments 36 at the process stage of FIG. 32. Such segments extend vertically beyond the front surfaces 79 of the conductive regions 22; and specifically have regions 98 which are vertically outward of the front surfaces 79.

Figure 33:
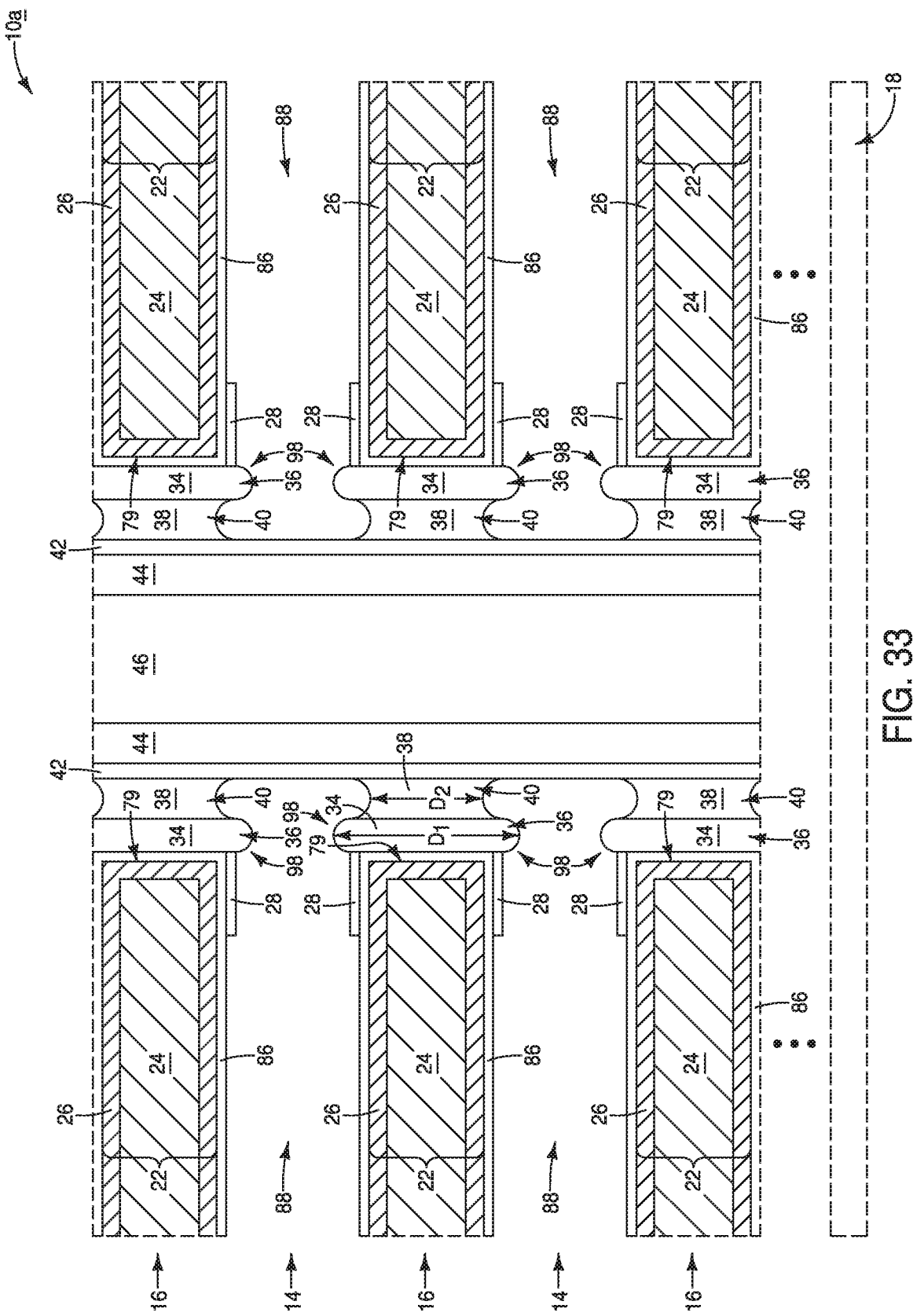

Referring to FIG. 33, the second voids 88 are extended through the charge-storage material 38 to divide the charge-storage material into the vertically-spaced segments 40. The illustrated embodiment has the second voids 88 terminating at the gate-dielectric material 42. In other embodiments, the second voids may punch through the gate dielectric material.

In the illustrated embodiment of FIG. 33, the first segments 36 (the segments of the charge-blocking material 34) have a first vertical dimension $D_1$, and the second segments 40 (the segments of the charge-storage material 38) have a second vertical dimension $D_2$ which is less than $D_1$. The vertically-extended regions 98 of the charge-blocking segments 36 can advantageously protect some of the charge-storage material 38 during the etching through the charge-storage material. Accordingly, the vertical dimension D2 of the charge-storage segments 38 is larger than it would be if the vertically-extended regions 98 were smaller, or were omitted. It can be desired that the charge-storage segments 40 be at least as long as the front surfaces 79 of the conductive regions 22 to enable the entirety of the front surfaces 79 to be involved in retaining charge in the segments 40.

Figure 34:
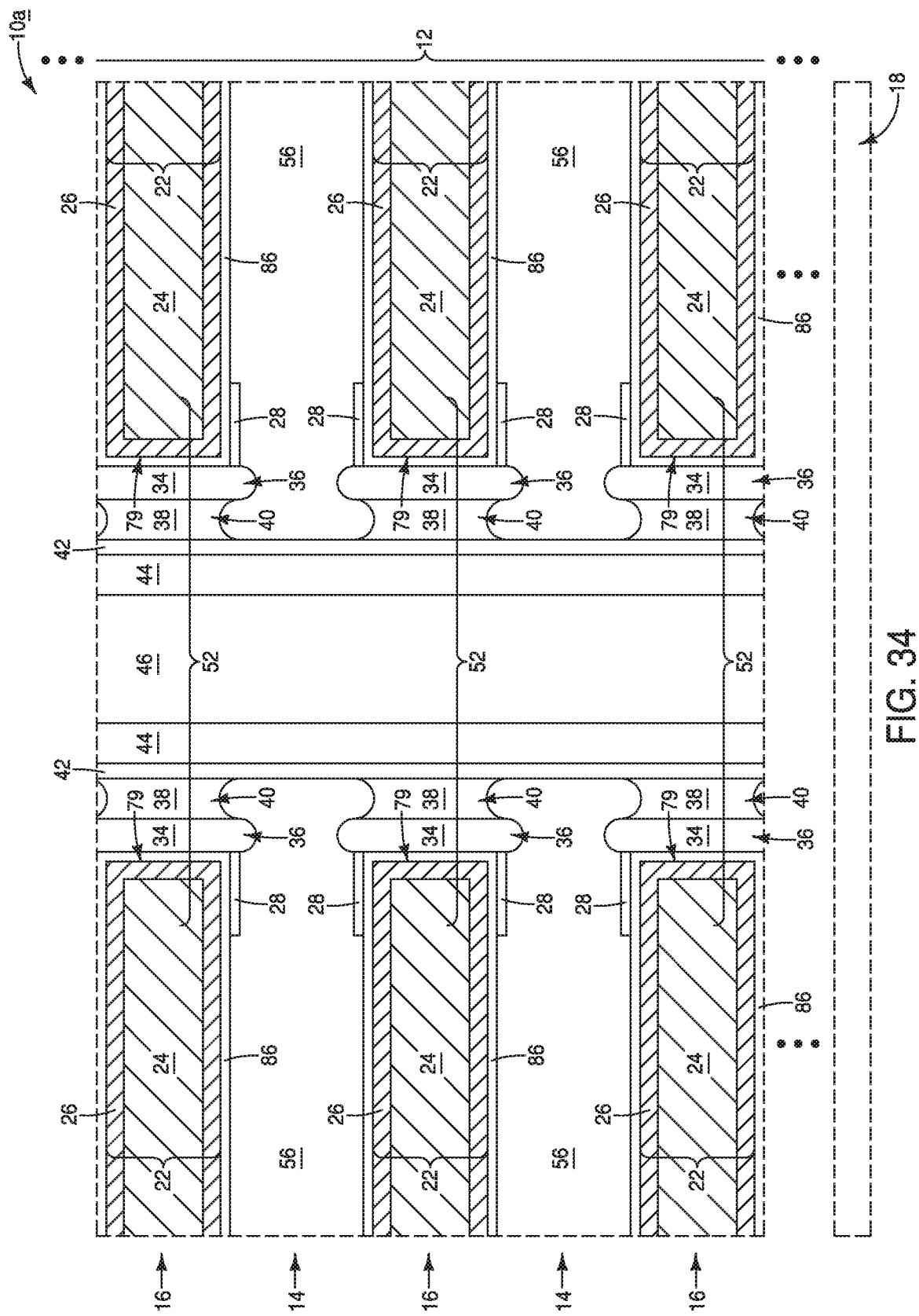

Referring to FIG. 34, the insulative material 56 is formed within the second voids 88 (FIG. 33). The configuration of FIG. 34 comprises NAND memory cells 52 analogous to those described above with reference to FIG. 20.

Figure 35:
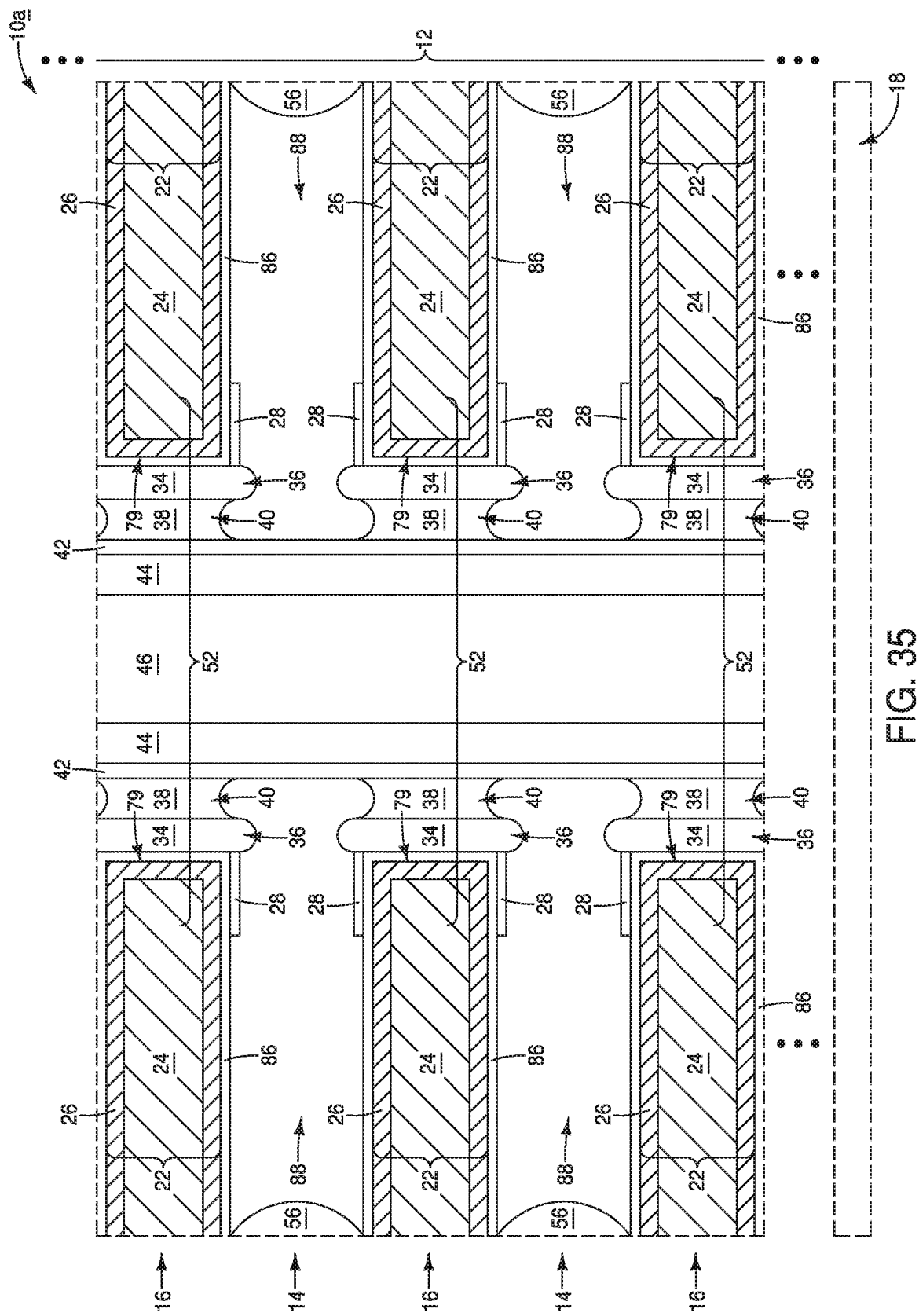
FIG. 35 is a diagrammatic cross-sectional side view of the region of the integrated assembly of FIG. 24 shown at an example process stage alternative to that of FIG. 34.

In the embodiment of FIG. 34, the insulative levels 14 are entirely filled with the insulative material 56. In other embodiments, portions of the voids 88 may remain within the insulative levels 14; as shown in FIG. 35.

The charge-storage material 38 may be configured to store information in the memory cells 52 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 54, and/or based on the value of voltage applied to the channel material 44.

The tunneling material 42 forms tunneling regions of the memory cells 52. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 adjacent the charge-storage material 38 may provide a mechanism to block charge from flowing from the charge-storage material 38 to the associated gates 54.

The dielectric-barrier material (high-k material) 86 (or the barrier structures 86/28) provided between the charge-blocking material 34 and the associated gates 54 may be utilized to inhibit back-tunneling of charge carriers from the gates 54 toward the charge-storage material 38. In some embodiments, the dielectric-barrier material 86 (or the barrier structures 86/28) may be considered to form dielectric-barrier regions within the memory cells 52.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both he utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can he directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. The conductive levels have terminal regions, and having nonterminal regions proximate the terminal regions. The terminal regions have top surfaces and bottom surfaces, and have vertically-extending sidewall surfaces between the top surfaces and the bottom surfaces. High-k dielectric material wraps around the terminal regions. First regions of the high-k dielectric material are along the top surfaces and the bottom surfaces, and second regions of the high-k dielectric material are along the vertically-extending sidewall surfaces. The first regions are thicker than the second regions. Charge-blocking material is arranged in vertically-stacked first segments. The first segments are adjacent to the second regions of the high-k dielectric material. Charge-storage material is arranged in vertically-stacked second segments. The second segments are adjacent to the first segments. Gate-dielectric material is adjacent to the charge-storage material. Channel material is adjacent to the gate-dielectric material.

Some embodiments include a NAND memory array having a vertical stack of alternating insulative levels and conductive levels. The conductive levels include control gate regions and distal regions proximate the control gate regions. The control gate regions have front surfaces, top surfaces and bottom surfaces. The top and bottoms surfaces extend back from the front surfaces. High-k dielectric material is along the control gate regions. The high-k dielectric material has first regions along the top and bottom surfaces, and has second regions along the front surfaces. The first regions are thicker than the second regions. Charge-blocking material is adjacent to the second regions of the high-k dielectric material. The charge-blocking material is configured as first vertically-extending segments which are vertically spaced from one another. Charge-storage material is adjacent to the charge-blocking material. The charge-storage material is configured as second vertically-extending segments which are vertically spaced from one another. Gate-dielectric material is adjacent to the charge-storage material. Channel material extends vertically along the stack and is adjacent to the gate-dielectric material.

Some embodiments include a method of forming an integrated structure. A vertical stack of alternating first and second levels is formed. The first levels comprise first material and the second levels comprise second material. An opening is formed to extend through the stack. The first levels are recessed relative to the second levels. The second levels have terminal ends which extend beyond the recessed first levels. The terminal ends have surfaces of the second material. The recessed first levels have surfaces of the first material. The surfaces of the first and second materials form an undulating sidewall surface of the opening. Cavities are vertically between the terminal ends and are adjacent to the recessed first levels. A first high-k dielectric material is formed along the undulating sidewall surface. The first high-k dielectric material wraps around the terminal ends and extends into the cavities. The first high-k dielectric material has first portions within the cavities, and has second portions outward of the cavities. The first portions of the high-k dielectric material having substantially horizontal segments along the second material of the second levels, and have substantially vertical segments extending between the substantially horizontal segments. Sacrificial material plugs are formed within the cavities and adjacent to the first portions of the first high-k material. The second portions of the first high-k material are removed to form, along a cross-section, substantially straight peripheral sidewalk of the opening. The substantially straight peripheral sidewalk extend along the second material, the high-k dielectric material and the sacrificial material plugs. A layer is formed along the substantially straight peripheral sidewalls. Charge-storage material is formed adjacent to the layer. Gate-dielectric material is formed adjacent to the charge-storage material. Channel material is formed adjacent to the gate-dielectric material. The second material is removed to leave first voids. Regions of the layer are exposed by the first voids. The exposed regions are oxidized to form charge-blocking material. The first voids are lined with a second high-k dielectric material. Conductive levels are formed within the lined first voids. The conductive levels have front surfaces facing the charge-blocking material, and have upper and lower surfaces extending back from the front surfaces. The first material, the substantially vertical segments of the first portions of the first high-k dielectric material, and the sacrificial material plugs are removed to leave second voids. The second voids are extended through the charge-storage material to divide the charge-storage material into vertically-spaced segments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
a vertical stack of alternating insulative levels and conductive levels;
the conductive levels having terminal regions, and having nonterminal regions proximate the terminal regions; the terminal regions having top surfaces and bottom surfaces, and having vertically-extending sidewall surfaces between the top surfaces and the bottom surfaces;
high-k dielectric material wrapping around the terminal regions; first regions of the high-k dielectric material being along the top surfaces and the bottom surfaces, second regions of the high-k dielectric material being along the vertically-extending sidewall surfaces, and third regions of the high-k dielectric material being along the nonterminal regions; the first regions being thicker than the second regions and the third regions;
charge-blocking material arranged in vertically-stacked first segments;
the first segments being adjacent the second regions of the high-k dielectric material;
charge-storage material arranged in vertically-stacked second segments; the second segments being adjacent the first segments;
gate-dielectric material adjacent the charge-storage material; and
channel material adjacent the gate-dielectric material.

2. The integrated structure of claim 1 wherein the third regions of the high-k dielectric material have a thickness which is about the same as the thickness of the second regions of the high-k dielectric material.

3. The integrated structure of claim 1 wherein the third regions of the high-k dielectric material have a thickness which is less than the thickness of the first regions of the high-k dielectric material.

4. The integrated structure of claim 1 wherein the first regions of the high-k dielectric material are at least about 20% thicker than the second regions of the high-k dielectric material.

5. The integrated structure of claim 1 wherein the first regions of the high-k dielectric material are at least about twice as thick as the second regions of the high-k dielectric material.

6. The integrated structure of claim 1 wherein the first regions of the high-k dielectric material are at least about three-times as thick as the second regions of the high-k dielectric material.

7. The integrated structure of claim 1 wherein the second regions of the high-k dielectric material have a thickness within a range of from about 1 nm to about 6 nm; and wherein the first regions of the high-k dielectric material have a thickness within a range of from about 3 nm to about 12 nm.

8. The integrated structure of claim 1 wherein the high-k dielectric material has a single homogeneous composition throughout the first and second regions.

9. The integrated structure of claim 1 wherein the high-k dielectric material comprises one or more of aluminum oxide, hafnium oxide, hafnium silicate, zirconium oxide and zirconium silicate.

10. An integrated structure, comprising:
a vertical stack of alternating insulative levels and conductive levels;
the conductive levels having terminal regions, and having nonterminal regions proximate the terminal regions; the terminal regions having top surfaces and bottom surfaces, and having vertically-extending sidewall surfaces between the top surfaces and the bottom surfaces;
high-k dielectric material wrapping around the terminal regions; first regions of the high-k dielectric material being along the top surfaces and the bottom surfaces, and second regions of the high-k dielectric material being along the vertically-extending sidewall surfaces; the first regions being thicker than the second regions, the high-k dielectric material having a first composition throughout the second regions, and comprises laminate configurations throughout the first regions; the laminate configurations comprising a second composition over the first composition, with the second composition being different from the first composition;
charge-blocking material arranged in vertically-stacked first segments; the first segments being adjacent the second regions of the high-k dielectric material;
charge-storage material arranged in vertically-stacked second segments; the second segments being adjacent the first segments;
gate-dielectric material adjacent the charge-storage material; and
channel material adjacent the gate-dielectric material.

11. A NAND memory array, comprising:
a vertical stack of alternating insulative levels and conductive levels;
the conductive levels including control gate regions and distal regions proximate the control gate regions; the control gate regions having front surfaces, top surfaces and bottom surfaces; the top and bottoms surfaces extending back from the front surfaces;
high-k dielectric material along the control gate regions; the high-k dielectric material having first regions along the top and bottom surfaces, having second regions along the front surfaces, and having third regions along the distal regions of the conductive levels; the first regions being thicker than the second regions and the third regions;
charge-blocking material adjacent the second regions of the high-k dielectric material; the charge-blocking material being configured as first vertically-extending segments which are vertically spaced from one another;
charge-storage material adjacent the charge-blocking material; the charge-storage material being configured as second vertically-extending segments which are vertically spaced from one another;
gate-dielectric material adjacent the charge-storage material; and
channel material extending vertically along the stack and being adjacent the gate-dielectric material.

12. The NAND memory array of claim 11 wherein the insulative levels are at least partially filled with insulative material.

13. The NAND memory array of claim 12 wherein the insulative levels are only partially filled with the insulative material.

14. The NAND memory array of claim 12 wherein the insulative levels are entirely filled with the insulative material.

15. The NAND memory array of claim 11 wherein the first regions are at least about twice as thick as the second regions.

16. The NAND memory array of claim 11 wherein only a single homogeneous composition of the high-k dielectric material is throughout the first and second regions.

17. The NAND memory array of claim 11 wherein the first vertically-extending segments have a first vertical dimension, and wherein the second vertically-extending segments have a second vertical dimension which is less than or about equal to the first vertical dimension.

18. The NAND memory array of claim 17 wherein the second vertical dimension is less than the first vertical dimension.

19. A NAND memory array, comprising:
a vertical stack of alternating insulative levels and conductive levels;
the conductive levels including control gate regions and distal regions proximate the control gate regions; the control gate regions having front surfaces, top surfaces and bottom surfaces; the top and bottoms surfaces extending back from the front surfaces;
high-k dielectric material along the control gate regions; the high-k dielectric material having first regions along the top and bottom surfaces, and having second regions along the front surfaces; the first regions being thicker than the second regions; wherein a first composition of the high-k dielectric material is throughout the second regions, and wherein laminate configurations of the high-k dielectric material are throughout the first regions;
the laminate configurations comprising a second composition of the high-k dielectric material over the first composition of the high-k dielectric material, with the second composition being different from the first composition;
charge-blocking material adjacent the second regions of the high-k dielectric material; the charge-blocking material being configured as first vertically-extending segments which are vertically spaced from one another;
charge-storage material adjacent the charge-blocking material; the charge-storage material being configured as second vertically-extending segments which are vertically spaced from one another;
gate-dielectric material adjacent the charge-storage material; and
channel material extending vertically along the stack and being adjacent the gate-dielectric material.

* * * * *